United States Patent
Sakai et al.

(10) Patent No.: US 11,283,425 B2
(45) Date of Patent: Mar. 22, 2022

(54) PIEZOELECTRIC RESONATOR UNIT

(71) Applicant: Murata Manufacturing Co., Ltd., Nagaokakyo (JP)

(72) Inventors: Motoyoshi Sakai, Nagaokakyo (JP); Kazuyuki Noto, Nagaokakyo (JP); Jun Konishi, Nagaokakyo (JP); Isao Ikeda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 103 days.

(21) Appl. No.: 16/800,449

(22) Filed: Feb. 25, 2020

(65) Prior Publication Data

US 2020/0195226 A1  Jun. 18, 2020

Related U.S. Application Data

(63) Continuation of application No. PCT/JP2018/030259, filed on Aug. 14, 2018.

(30) Foreign Application Priority Data

Sep. 1, 2017 (JP) .............................. JP2017-168826

(51) Int. Cl.
*H03H 9/19* (2006.01)
*H03H 9/05* (2006.01)
(Continued)

(52) U.S. Cl.
CPC ............ *H03H 9/19* (2013.01); *H03H 9/0552* (2013.01); *H03H 9/10* (2013.01); *H03H 9/132* (2013.01)

(58) Field of Classification Search
CPC ........ H03H 9/19; H03H 9/20552; H03H 9/10; H03H 9/132; H03H 9/05; H03H 9/02094; H03H 9/1035; H03H 9/02
See application file for complete search history.

(56) References Cited

U.S. PATENT DOCUMENTS 8,476,811 B2   7/2013   Mizusawa et al.
2012/0032561 A1*  2/2012   Mizusawa ............ H03H 9/0595
                                                    310/344
(Continued)

FOREIGN PATENT DOCUMENTS

JP    S58197909 A    11/1983
JP    H08139562 A    5/1996
(Continued)

OTHER PUBLICATIONS

International Search Report issued in PCT/JP2018/030259, dated Oct. 30, 2018.
(Continued)

*Primary Examiner* — Jeffrey M Shin
(74) *Attorney, Agent, or Firm* — Arent Fox LLP

(57) ABSTRACT

A piezoelectric resonator unit includes a piezoelectric substrate, first and second excitation electrodes, first and second connecting electrodes, and first and second exterior members. The first excitation electrode and first connecting electrode are disposed on a first main surface of the piezoelectric substrate and are electrically connected to each other. Similarly, the second excitation electrode and the second connecting electrode are disposed on a second main surface of the piezoelectric substrate and are electrically connected to each other. First and second exterior members bonded to the substrate with sealing members interposed. The first exterior member includes a first terminal portion formed in a shape that externally exposes at least part of the first connecting electrode. A first outer electrode covers the first terminal portion and the exposed portion of the first connecting electrode protruding from the first exterior member.

18 Claims, 13 Drawing Sheets

(51) Int. Cl.
*H03H 9/10* (2006.01)
*H03H 9/13* (2006.01)

(56) References Cited

U.S. PATENT DOCUMENTS

| | | | |
|---|---|---|---|
| 2012/0098390 A1* | 4/2012 | Takahashi | H03H 9/1035 310/348 |
| 2018/0323768 A1 | 11/2018 | Ikeda et al. | |

FOREIGN PATENT DOCUMENTS

| | | |
|---|---|---|
| JP | H0951244 A | 2/1997 |
| JP | 2003163558 A | 6/2003 |
| JP | 2012060628 A | 3/2012 |
| JP | 2017085327 A | 5/2017 |
| WO | 2017126185 A1 | 7/2017 |

OTHER PUBLICATIONS

Written Opinion of the International Searching Authority issued in PCT/JP2018/030259, dated Oct. 30, 2018.

* cited by examiner

FIG. 2
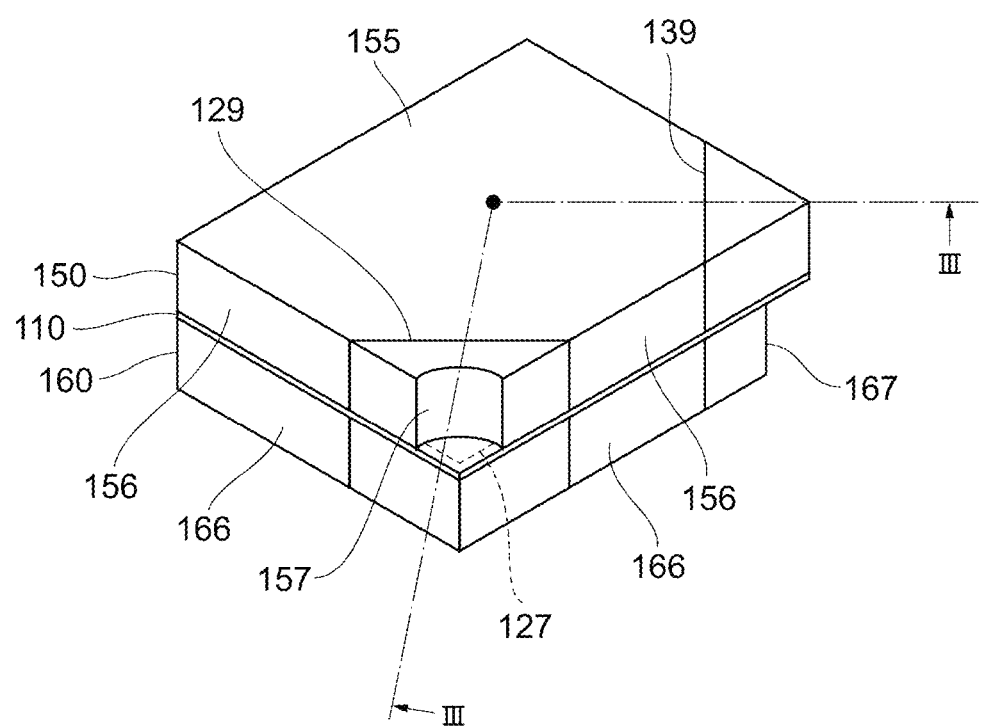
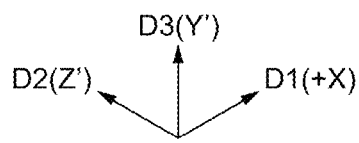

FIG. 4
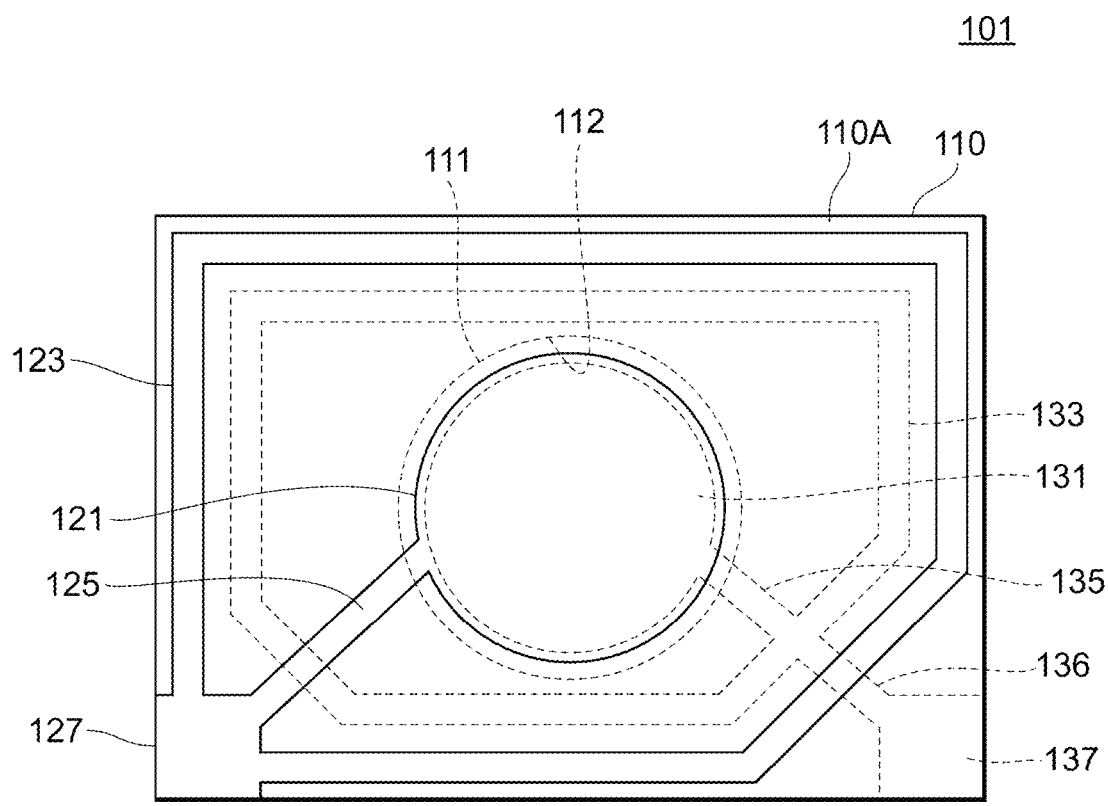
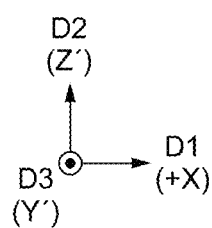

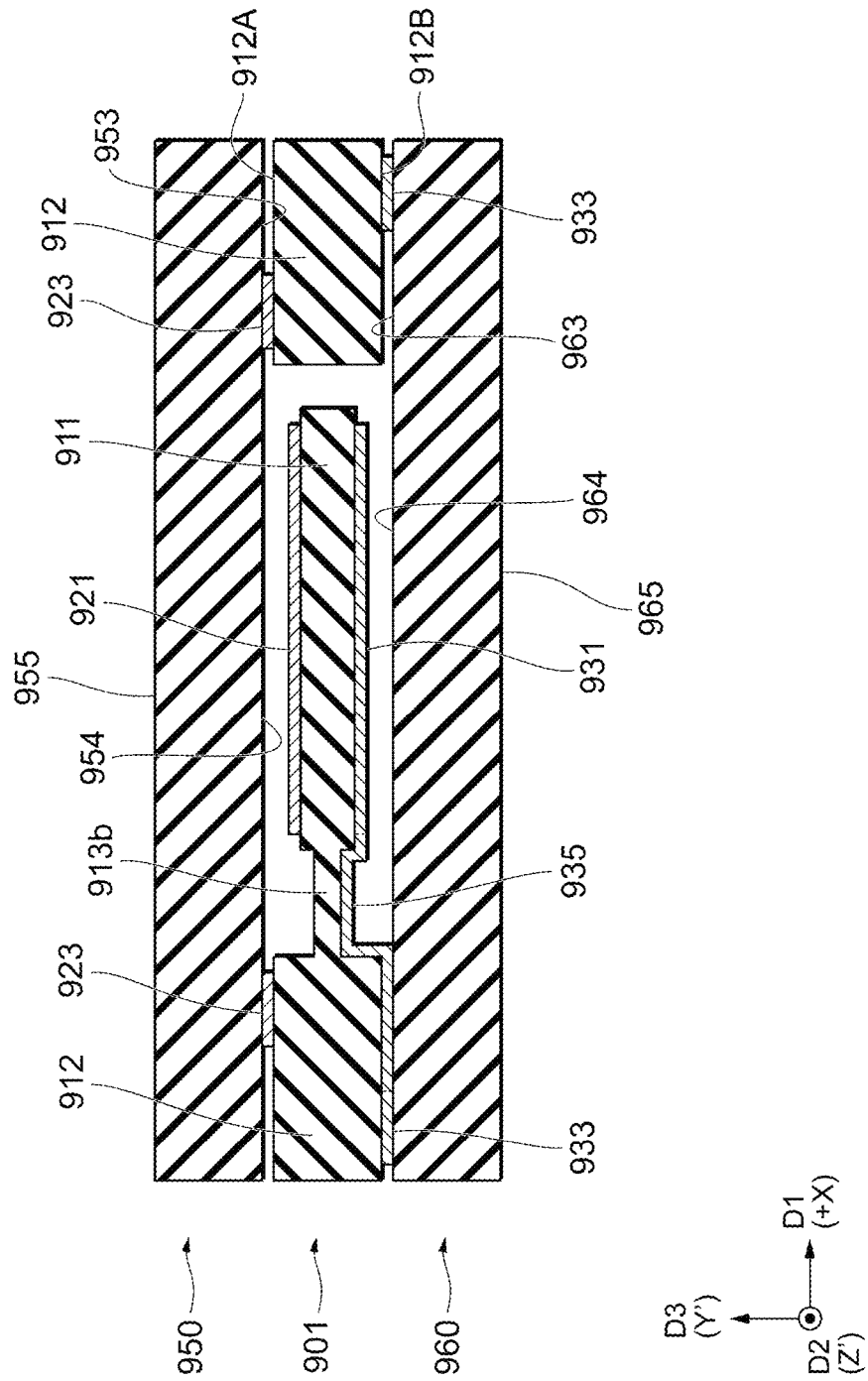

PIEZOELECTRIC RESONATOR UNIT

CROSS REFERENCE TO RELATED APPLICATIONS

The present application is a continuation of PCT/JP2018/030259 filed Aug. 14, 2018, which claims priority to Japanese Patent Application No. 2017-168826, filed Sep. 1, 2017, the entire contents of each of which are incorporated herein by reference.

TECHNICAL FIELD

The present invention relates to a piezoelectric resonator unit that may be used as a timing device and a load sensor, for example.

BACKGROUND

Currently, a piezoelectric resonator unit is installed in a mobile communication device, for example, and can be used as a timing device and a load sensor, for example. In particular, a quartz crystal resonator unit, which is one type of piezoelectric resonator unit, uses a synthetic quartz crystal in a piezoelectric member and has a high frequency accuracy. As recent electronic devices are becoming smaller, it is also desirable to reduce the size of piezoelectric resonator units.

For example, Patent Document 1 (identified below) discloses a piezoelectric resonator unit that includes a multilayer body, excitation electrodes, extended electrodes, and outer electrodes. The multilayer body is formed by integrally stacking first and second exterior members with a piezoelectric substrate interposed therebetween by using an adhesive. The excitation electrodes are disposed at the center of the top surface and at the center of the bottom surface of the piezoelectric substrate. The extended electrodes are provided continuously from the excitation electrodes and reach both edges in the vicinity of the end surfaces of the piezoelectric substrate. The outer electrodes are disposed on the side surfaces of the multilayer body and are electrically connected to the extended electrodes.

Patent Document 1: Japanese Unexamined Patent Application Publication No. 2003-163558.

In the piezoelectric resonator unit disclosed in Patent Document 1, the end surfaces of the extended electrodes contact the outer electrodes. That is, the extended electrode and the corresponding outer electrode are connected with each other in a T-like shape in cross section. In this configuration, resonance generated by the excitation electrode is transmitted through the extended electrode and is reflected at a contact portion between the extended electrode and the outer electrode so as to return to the excitation electrode. This configuration may degrade the resonance characteristics of the piezoelectric resonator unit. Additionally, to prevent short-circuiting between the extended electrodes, an insulating adhesive is used as the adhesive for bonding the piezoelectric substrate and the exterior members. The air tightness is thus lower than that when metal bonding using a brazing material is performed. As a result, the resonance characteristics may be degraded because of the oxidation of the excitation electrodes.

SUMMARY OF THE INVENTION

The exemplary embodiments of the present invention have been made in view of the above-described background. Specifically, it is an object of the invention to provide a piezoelectric resonator unit whose resonance characteristics are less likely to be degraded.

Accordingly, a piezoelectric resonator unit according to an exemplary aspect includes a piezoelectric substrate, first and second excitation electrodes, first and second connecting electrodes, and first and second exterior members. The piezoelectric substrate has first and second main surfaces opposing each other. The first excitation electrode is disposed on the first main surface of the piezoelectric substrate. Moreover, the first connecting electrode is disposed on the first main surface of the piezoelectric substrate and is electrically connected to the first excitation electrode. The second excitation electrode is disposed on the second main surface of the piezoelectric substrate and opposes the first excitation electrode with the piezoelectric substrate interposed therebetween. The second connecting electrode is disposed on the second main surface of the piezoelectric substrate and is electrically connected to the second excitation electrode. The first exterior member is bonded to the piezoelectric substrate with a first sealing member interposed therebetween and covers the first excitation electrode with a space between the first exterior member and the first excitation electrode. Similarly, the second exterior member is bonded to the piezoelectric substrate with a second sealing member interposed therebetween and covers the second excitation electrode with a space between the second exterior member and the second excitation electrode. The first exterior member includes a first terminal portion. The first terminal portion is formed in a shape which externally exposes at least part of the first connecting electrode. Moreover, a first outer electrode is provided to cover the first terminal portion of the first exterior member and an exposed portion of the first connecting electrode protruding from the first exterior member.

According to the exemplary embodiments of the present invention, a piezoelectric resonator unit is providing having improved resonance characteristics that are less likely to be degraded.

BRIEF DESCRIPTION OF DRAWINGS

FIG. 2 is a perspective view schematically illustrating the configuration of the quartz crystal resonator unit shown in FIG. 1.

FIG. 4 is a plan view schematically illustrating the configuration of a quartz crystal substrate in the first exemplary embodiment.

FIG. 13 is a sectional view schematically illustrating the configuration of the quartz crystal resonator unit according to the seventh exemplary embodiment.

DETAILED DESCRIPTION OF EMBODIMENTS

Figure 1:
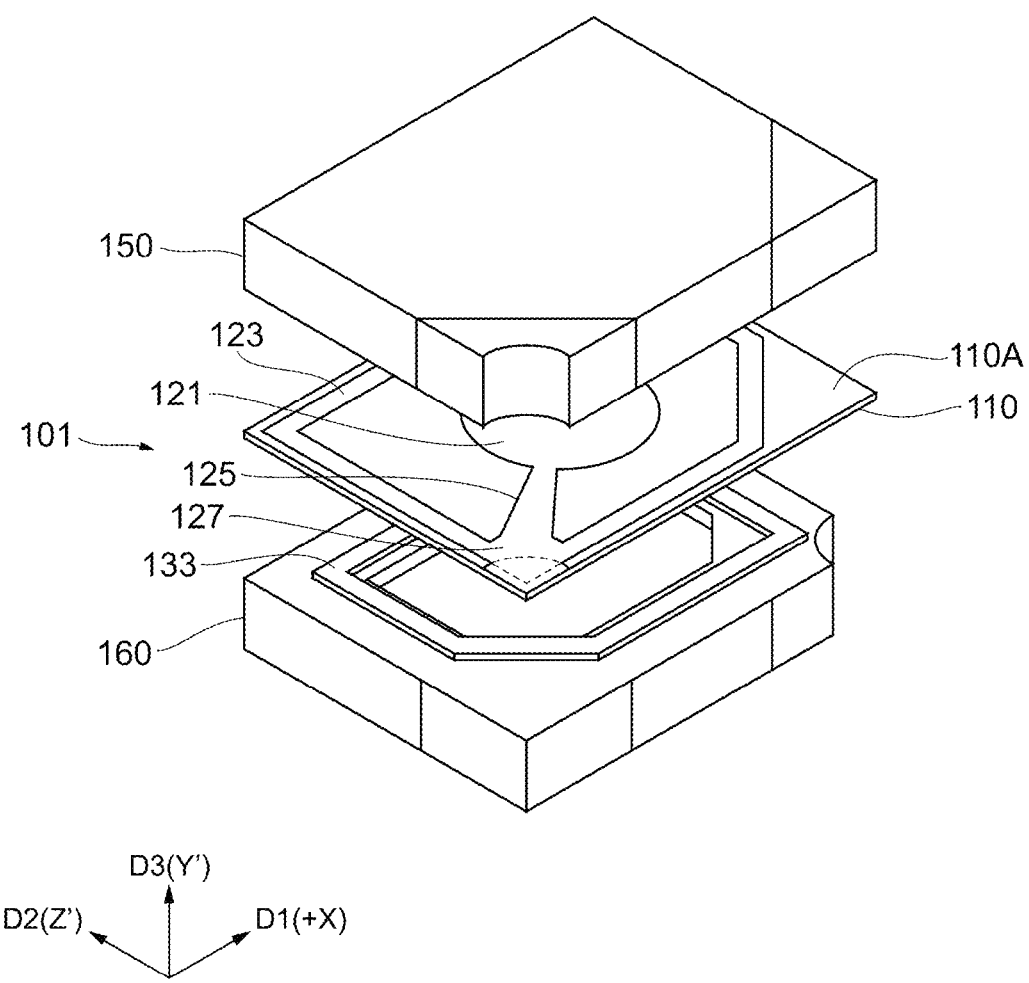
FIG. 1 is an exploded perspective view schematically illustrating the configuration of a quartz crystal resonator unit according to a first exemplary embodiment.

Exemplary embodiments of the present invention will be described below with reference to the accompanying drawings. In second through seventh embodiments, elements identical to or similar to those of a first embodiment will be designated by like reference numerals, and a detailed explanation thereof will be omitted. Similarly, an explanation of advantages obtained by the second through seventh embodiments similar to those of the first embodiment will be omitted. The drawings representing the exemplary embodiments are only examples, and the dimensions and the configurations of the individual elements are illustrated merely schematically. The exemplary embodiments are not intended to be exhaustive or to limit the technical scope of the invention of this application.

In the following description, a quartz crystal resonator unit including a quartz crystal resonator will be taken as an example of a piezoelectric resonator unit. A quartz crystal resonator is a resonator using a quartz crystal element as a piezoelectric substrate which resonates in response to an applied voltage. Piezoelectric resonator units according to the individual embodiments are not restricted to quartz crystal resonator units. They may be piezoelectric resonator units using a piezoelectric resonator formed by another type of piezoelectric substrate, such as a ceramic piezoelectric substrate.

First Exemplary Embodiment

Figure 3:
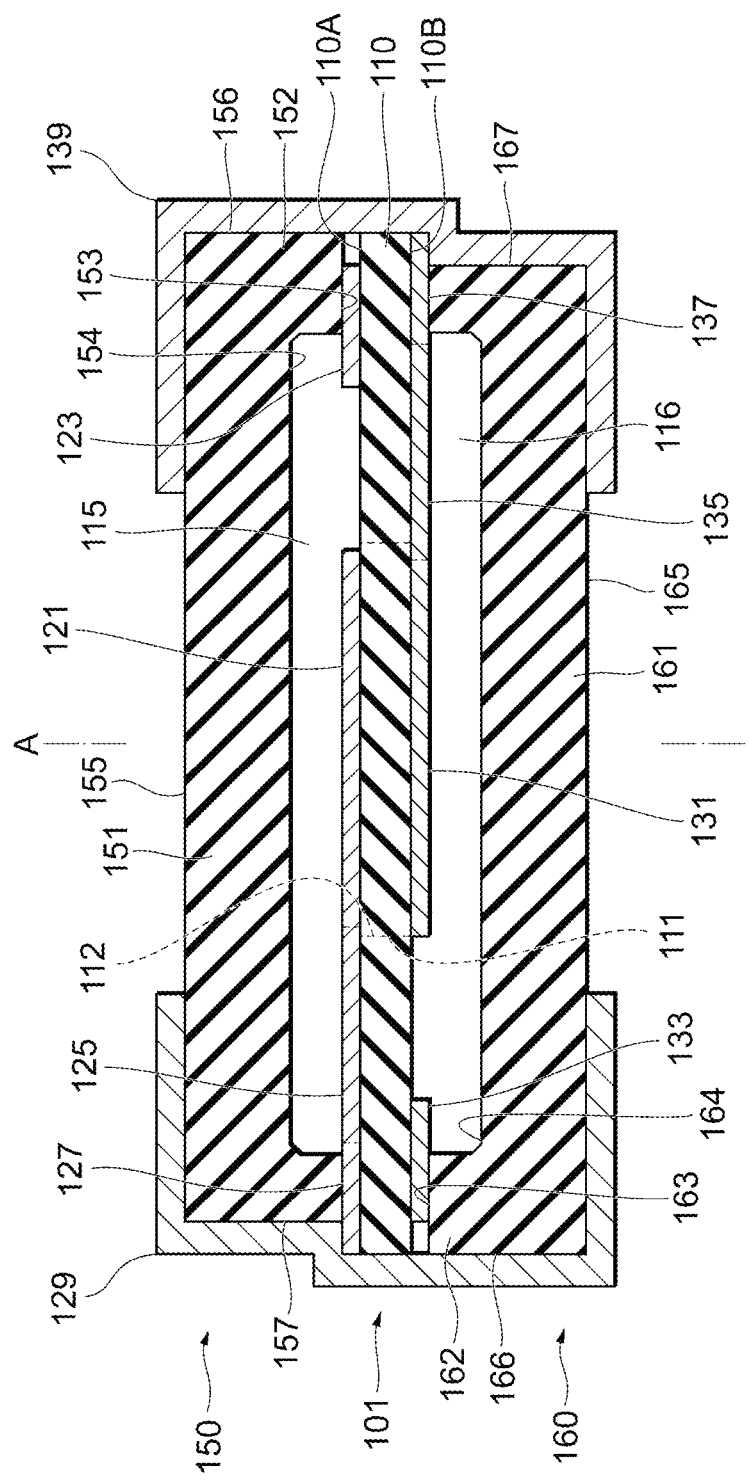
FIG. 3 is a sectional view schematically illustrating the configuration of the quartz crystal resonator unit taken along line III-III in FIG. 2.

First, the configuration of a quartz crystal resonator unit 100 according to a first exemplary embodiment will be described below with reference to FIGS. 1 through 4. FIG. 1 is an exploded perspective view schematically illustrating the configuration of the quartz crystal resonator unit according to the first embodiment. FIG. 2 is a perspective view schematically illustrating the configuration of the quartz crystal resonator unit shown in FIG. 1. FIG. 3 is a sectional view schematically illustrating the configuration of the quartz crystal resonator unit taken along line III-III in FIG. 2. FIG. 4 is a plan view schematically illustrating the configuration of a quartz crystal substrate in the first embodiment. In general, a first direction D1, a second direction D2, and a third direction D3 shown in the drawings are perpendicular to one another. However, these directions may not necessarily cross at right angles and may intersect one another at an angle other than 90°, for example.

As shown, the quartz crystal resonator unit 100 includes a quartz crystal resonator 101, a first exterior member 150, and a second exterior member 160, which can each be considered lids or covers for the quartz crystal resonator 101. The quartz crystal resonator unit 100 has a so-called sandwich structure in which the quartz crystal resonator 101 is sandwiched between the first and second exterior members 150 and 160. In the quartz crystal resonator unit 100, which is one type of piezoelectric resonator unit, the quartz crystal resonator 101 is excited in accordance with an applied voltage. The quartz crystal resonator 101 uses a quartz crystal element as a piezoelectric member which resonates in response to the applied voltage.

The quartz crystal resonator 101 includes a planar quartz crystal substrate 110. The quartz crystal substrate 110 corresponds to a piezoelectric substrate. The quartz crystal substrate 110 has a first main surface 110A and a second main surface 110B opposing each other. The first main surface 110A is located on the side opposing the first exterior member 150, while the second main surface 110B is located on the side opposing the second exterior member 160.

In an exemplary aspect, the quartz crystal substrate 110 is an AT-cut quartz crystal element, for example. The AT-cut quartz crystal element is a thin-film quartz crystal which is cut from a synthetic quartz crystal so that a plane parallel with a plane defined by the X axis and the Z' axis (hereinafter, such a plane will be called "the XZ' plane", and a plane defined by other axes will also be called in this manner) serves as the main surface. The X, Y, and Z axes are the crystal axes of a synthetic quartz crystal. The Y' axis is an axis formed by rotating the Y axis around the X axis in a direction from the Y axis to the Z axis by 35°15'±1'30". Likewise, the Z' axis is an axis formed by rotating the Z axis around the X axis in a direction from the Y axis to the Z axis by 35°15'±1'30". That is, in the quartz crystal substrate 110, which is an AT-cut quartz crystal element, the first and second main surfaces 110A and 110B each correspond to the XZ' plane. The cut angle of the quartz crystal element may be other than the AT-cut angle (the BT-cut angle, for example).

The AT-cut quartz crystal substrate 110 has a longitudinal direction in which a long side extends in the X-axis direction, a widthwise direction in which a short side extends in the Z'-axis direction, and a thickness direction in which a thickness side extends in the Y'-axis direction. The quartz crystal substrate 110 has a rectangular shape in a plan view of the first main surface 110A, and includes an excitation portion 111 and a peripheral portion 112 (see, e.g., FIGS. 3 and 4). The excitation portion 111 is located substantially at the center and is excited to produce resonance. The peripheral portion 112 surrounds the excitation portion 111. The excitation portion 111 and the peripheral portion 112 are continuously provided. The quartz crystal substrate 110 is formed in a flat shape in which the excitation portion 111 and the peripheral portion 112 have substantially the same thickness. However, the quartz crystal substrate 110 is not limited to this configuration if it is formed in a planar shape. For example, the quartz crystal substrate 110 may have a mesa structure in which the excitation portion 111 is thicker than the peripheral portion 112. Conversely, the quartz crystal substrate 110 may have an inverted mesa structure in which the excitation portion 111 is thinner than the peripheral portion 112. The quartz crystal substrate 110 may alternatively be formed in a convex shape or a bevel shape in which the thicknesses of the excitation portion 111 and the peripheral portion 112 are progressively changed. If the quartz crystal substrate 110 has a planar shape, the excitation portion 111 of the quartz crystal substrate 110 is easily deformed by an external load applied to the quartz crystal resonator unit 100. The quartz crystal resonator unit 100 sensitively responds to a load to change the resonance characteristics. Hence, the quartz crystal resonator unit 100 can be suitably used as a load sensor. Moreover, a slit may be formed between the excitation portion 111 and the peripheral portion 112, as will be discussed later.

In the example of the configuration shown in FIGS. 1 and 2, the quartz crystal substrate 110 is disposed so that the X axis is parallel with the first direction D1, the Z' axis is parallel with the second direction D2, and the Y' axis is parallel with the third direction D3.

A quartz crystal resonator using an AT-cut quartz crystal element exhibits high-stability frequency characteristics over a wide temperature range and excellent temporal change characteristics, and can also be manufactured at low cost. This type of quartz crystal resonator can thus be suitably used as a timing device. The quartz crystal resonator is also sensitive to an external load, and the excitation frequency is changed in accordance with the deformation of the quartz crystal resonator. Hence, the quartz crystal resonator can also be suitably used as a load sensor. According to the exemplary embodiment, the AT-cut quartz crystal resonator uses the thickness shear mode as the main resonation mode.

The quartz crystal resonator 101 includes first and second excitation electrodes 121 and 131, which form a pair of electrodes as shown in FIG. 3, for example. The first and second excitation electrodes 121 and 131 are located at positions corresponding to the position of the excitation portion 111. The first excitation electrode 121 is disposed on the first main surface 110A of the quartz crystal substrate 110, while the second excitation electrode 131 is disposed on the second main surface 110B of the quartz crystal substrate 110. The first and second excitation electrodes 121 and 131 oppose each other with the quartz crystal substrate 110 interposed therebetween in the third direction D3. The first and second excitation electrodes 121 and 131 substantially entirely match each other in the XZ' plane in an exemplary aspect. Moreover, the first and second excitation electrodes 121 and 131 are provided in a circular shape in a plan view of the first and second main surfaces 110A and 110B. However, they are not restricted to a circular shape, and may be formed in a polygon, an ellipse, or a combination thereof, such as a rectangle.

The quartz crystal resonator 101 includes first and second conductive sealing members 123 and 133 having conductivity. The first and second conductive sealing members 123 and 133 that correspond to first and second sealing members, respectively. The first and second conductive sealing members 123 and 133 are disposed at positions corresponding to the position of the peripheral portion 112. The first conductive sealing member 123 is disposed on the first main surface 110A of the quartz crystal substrate 110. The first conductive sealing member 123 is formed in a frame-like shape to surround the first excitation electrode 121 in a plan view of the first main surface 110A of the quartz crystal substrate 110. The second conductive sealing member 133 is disposed on the second main surface 110B of the quartz crystal substrate 110. The second conductive sealing member 133 is formed in a frame-like shape to surround the second excitation electrode 131 in a plan view of the second main surface 110B.

The quartz crystal resonator 101 includes first and second extended electrodes 125 and 135. The first extended electrode 125 is disposed on the first main surface 110A of the quartz crystal substrate 110. The first extended electrode 125 electrically connects the first excitation electrode 121 and the first conductive sealing member 123. The second extended electrode 135 is disposed on the second main surface 110B of the quartz crystal substrate 110. The second extended electrode 135 electrically connects the second excitation electrode 131 and the second conductive sealing member 133.

In addition, the quartz crystal resonator 101 includes first and second connecting electrodes 127 and 137. The first and second connecting electrodes 127 and 137 are disposed at positions corresponding to the position of the peripheral portion 112 of the quartz crystal substrate 110. The first connecting electrode 127 is disposed on the first main surface 110A of the quartz crystal substrate 110. The second connecting electrode 137 is disposed on the second main surface 110B of the quartz crystal substrate 110.

The first connecting electrode 127 is provided continuously from the first conductive sealing member 123. In other words, the first connecting electrode 127 forms part of the first conductive sealing member 123, as shown in FIG. 4, for example. The first extended electrode 125 is directly connected with the first connecting electrode 127. The second connecting electrode 137 is separately provided outward of the second conductive sealing member 133 and is electrically connected to the second conductive sealing member 135 via a third extended electrode 136. The third extended electrode 136 is disposed on the second main surface 110B of the quartz crystal substrate 110. That is, the first connecting electrode 127 is electrically connected to the first conductive sealing member 123, while the second connecting electrode 137 is electrically connected to the second conductive sealing member 133. The first and second connecting electrodes 127 and 137 are not limited to the above-described configuration if they are electrically connected to the first and second conductive sealing members 123 and 133, respectively. For example, the first connecting electrode 127 may be provided separately from the first conductive sealing member 123 and be electrically connected to the first conductive sealing member 123 via another extended electrode. The provision of the third extended electrode 136 may be omitted, and the second connecting electrode 137 may form part of the second conductive sealing member 133.

As described above, on the first main surface 110A of the quartz crystal substrate 110, an electrode group formed by the first excitation electrode 121, the first conductive sealing member 123, the first extended electrode 125, and the first connecting electrode 127 is formed. On the second main surface 110B of the quartz crystal substrate 110, an electrode group formed by the second excitation electrode 131, the second conductive sealing member 133, the second extended electrode 135, and the second connecting electrode 137 is formed.

A description will be given of the positional relationship between the electrode group on the first main surface 110A and that on the second main surface 110B, in a plan view of the first main surface 110A of the quartz crystal substrate 110 in FIG. 4. The first and second conductive sealing members 123 and 133 are disposed separately from each other. Similarly, the first and second extended electrodes 125 and 135 are disposed separately from each other. The first and second connecting electrodes 127 and 137 are disposed separately from each other.

The first conductive sealing member 123 is disposed outward of the second conductive sealing member 133, that is, it is disposed in a direction in which it is separated from the excitation portion 111, so that it does not overlap the second conductive sealing member 133 in the Y' direction (i.e., the thickness direction). That is, the second conductive sealing member 133 surrounds the first and second excitation electrodes 121 and 131, and the first conductive sealing member 123 surrounds the second conductive sealing member 133. This configuration can regulate the excitation of the quartz crystal substrate 110 between the first and second conductive sealing members 123 and 133, thereby reducing the unwanted resonance to be added to the resonance generated in the excitation portion 111. The first and second conductive sealing members 123 and 133 may partially overlap each other if they do not at least partially overlap each other. For example, part of the inner side of the first conductive sealing member 123 may overlap the second conductive sealing member 133, and part of the outer side of the first conductive sealing member 123 may not overlap the second conductive sealing member 133.

Moreover, the first and second connecting electrodes 127 and 137 are disposed at end portions of the quartz crystal substrate 110. More specifically, the first connecting electrode 127 is located at a corner formed by the short side on the negative side of the first direction D1 and the long side on the negative side of the second direction D2 of the quartz crystal substrate 110. The second connecting electrode 137 is located at the corner formed by the short side on the positive side of the first direction D1 and the long side on the negative side of the second direction D2 of the quartz crystal substrate 110. That is, the first and second connecting electrodes 127 and 137 are disposed on the same edge side of the quartz crystal substrate 110. This configuration can regulate the excitation of the quartz crystal substrate 110 between the first and second connecting electrodes 127 and 137, thereby reducing the unwanted resonance to be added to the resonance generated in the excitation portion 111. It is noted that the positions of the first and second connecting electrodes 127 and 137 are not restricted to the above-described positions if they extend at end portions of the quartz crystal substrate 110. For example, the first and second connecting electrodes 127 and 137 may be located at diagonally positioned corners, or they may be located at the central portions of edge sides separate from the corners.

As further shown, the second connecting electrode 137 is disposed outward of the first conductive sealing member 123 so that it does not overlap the first conductive sealing member 123. This configuration can regulate the excitation of the quartz crystal substrate 110 between the second connecting electrode 137 and the first conductive sealing member 123. The second connecting electrode 137 and the first conductive sealing member 123 may be disposed in any manner if they do not at least partially overlap each other. For example, the side of the second connecting electrode 137 closer to the excitation portion 111 may overlap the first conductive sealing member 123, and the other side of the second connecting electrode 137 may not overlap the first conductive sealing member 123. Likewise, the first connecting electrode 127 is disposed outward of the second conductive sealing member 133 so that it does not overlap the second conductive sealing member 133. The first connecting electrode 127 and the second conductive sealing member 133 may also be disposed in any manner if they do not at least partially overlap each other.

According to the exemplary embodiment, the first extended electrode 125 extends in a direction in which the first excitation electrode 121 and the first connecting electrode 127 are connected with each other. Similarly, the second extended electrode 135 extends in a direction in which the second excitation electrode 131 and the second connecting electrode 137 are connected with each other. That is, the first and second extended electrodes 125 and 135 extend in different directions as viewed from the excitation portion 111. The third extended electrode 136 is aligned with the second extended electrode 135. This configuration can regulate the excitation of the quartz crystal substrate 110 between the first and second extended electrodes 125 and 135, thereby reducing the unwanted resonance to be added to the resonance generated in the excitation portion 111.

The first extended electrode 125 intersects the second conductive sealing member 133 (i.e., overlaps in a thickness direction) at one point with the quartz crystal substrate 110 interposed therebetween. Likewise, the third extended electrode 136 intersects the first conductive sealing member 123 (i.e., overlaps in a thickness direction) at one point with the quartz crystal substrate 110 interposed therebetween. This configuration can reduce the area by which the electrode group on the first main surface 110A and that on the second main surface 110B oppose each other. That is, this can regulate the excitation which causes the unwanted resonance at the peripheral portion 112, thereby reducing the unwanted resonance to be added to the resonance generated in the excitation portion 111. The first extended electrode 125 and the second conductive sealing member 133 are substantially perpendicular to each other. The third extended electrode 136 and the first conductive sealing member 123 are substantially perpendicular to each other. This configuration can further reduce the area by which the electrode group on the first main surface 110A and that on the second main surface 110B oppose each other.

The electrode group formed on the first main surface 110A of the quartz crystal substrate 110 is integrally and continuously formed by the same material according to an exemplary aspect. The electrode group formed on the second main surface 110B of the quartz crystal substrate 110 is also integrally and continuously formed by the same material. The materials for the individual electrode groups are not restricted to particular materials. For example, as an underlying layer, a chromium (Cr) layer is disposed on the side of the electrode group which contacts the quartz crystal substrate 110, and as a front layer, a gold (Au) layer is disposed on the side of the electrode group which is separated from the quartz crystal substrate 110. As a result of disposing a metal layer having a high reactivity with oxygen as the underlying layer, the adhesion between the quartz crystal substrate 110 and the electrode group is enhanced. As a result of disposing a metal layer having a low reactivity with oxygen as the front layer, the degradation of the excitation electrodes is reduced, thereby enhancing the electrical reliability.

The first exterior member 150 corresponds to one of a pair of retainers for storing the excitation portion 111 of the quartz crystal substrate 110 therein. The first exterior member 150, which is formed in a recessed shape, is formed in a box-like shape opened toward the first main surface 110A of the quartz crystal substrate 110. The first exterior member 150 is bonded to the quartz crystal substrate 110 with the first conductive sealing member 123 interposed therebetween so as to cover the first excitation electrode 121 with an internal space 115 formed between the first exterior member 150 and the first excitation electrode 121. The first exterior member 150 is not limited to a particular shape if it does not interfere with the excitation of the excitation portion 111. The first exterior member 150 may be a planar shape having a planar main surface opposing the quartz crystal substrate 110 or a tubular shape to store the quartz crystal substrate 110 therein.

As shown in FIG. 3, the first exterior member 150 has a top wall portion 151 and a side wall portion 152. The top wall portion 151 opposes the first main surface 110A of the quartz crystal substrate 110. The side wall portion 152 is connected to the outer edge of the top wall portion 151 and extends in a direction in which it intersects the main surface of the top wall portion 151.

The first exterior member 150 has an opposing surface 153, an inner surface 154, an outer main surface 155, and outer side surfaces 156. The opposing surface 153 is a surface which opposes, at the end edge of the side wall portion 152, the first main surface 110A of the quartz crystal substrate 110 corresponding to the position of the peripheral portion 112. In a plan view of the first main surface 110A of the quartz crystal substrate 110, the opposing surface 153 extends in a frame-like shape to surround the first excitation electrode 121. The inner surface 154 is located on the side of the top wall portion 151 and that of the side wall portion 152 facing the inner space 115. The inner surface 154 is a surface defined by the inner main surface which overlaps the first main surface 110A and the inner side surface which surrounds the first excitation electrode 121 in a plan view of the first main surface 110A of the quartz crystal substrate 110. The outer main surface 155 is located on the side of the top wall portion 151 opposite the inner space 115. The outer main surface 155 is a surface which overlaps the first main surface 110A of the quartz crystal substrate 110 in a plan view of the first main surface 110A. The outer side surfaces 156 are located on the sides of the side wall portion 152 opposite the inner space 115. The outer side surfaces 156 are surfaces linking the opposing surface 153 and the outer main surface 155.

As shown in FIG. 2, a first terminal portion 157 is formed in the first exterior member 150. The first terminal portion 157 is a structure for exposing at least part of the first connecting electrode 127. In a plan view of the outer main surface 155 of the first exterior member 150, the first terminal portion 157 is a hollow formed at a corner of the first exterior member 150 and is connected with the outer side surfaces 156. That is, the first terminal portion 157 exposes at least part of the first connecting electrode 127 to protrude from the end portion of the first exterior member 150. The first terminal portion 157 is formed from the opposing surface 153 to the outer main surface 155 in the third direction D3.

Moreover, the second exterior member 160 corresponds to the other one of the pair of retainers for storing the excitation portion 111 of the quartz crystal substrate 110 therein. The second exterior member 160, which is formed in a recessed shape, as in the first exterior member 150, is formed in a box-like shape opened toward the second main surface 110B of the quartz crystal substrate 110. The second exterior member 160 is bonded to the quartz crystal substrate 110 with the second conductive sealing member 133 interposed therebetween so as to cover the second excitation electrode 131 with an internal space 116 formed between the second exterior member 160 and the second excitation electrode 131. The structure of the second exterior member 160 is similar to that of the first exterior member 150, and a detailed explanation thereof will be omitted.

The second exterior member 160 has a top wall portion 161 and a side wall portion 162. The top wall portion 161 opposes the second main surface 110B of the quartz crystal substrate 110. The side wall portion 162 is connected to the outer edge of the top wall portion 161 and extends in a direction in which it intersects the main surface of the top wall portion 161. The second exterior member 160 has an opposing surface 163, an inner surface 164, an outer main surface 165, and outer side surfaces 166. The opposing surface 163 is a surface which opposes the second main surface 110B of the quartz crystal substrate 110 corresponding to the position of the peripheral portion 112. The inner surface 164 is located on the side of the top wall portion 161 and that of the side wall portion 162 facing the inner space 116. The outer main surface 165 is located on the side of the top wall portion 151 opposite the inner space 116. The outer side surfaces 166 are surfaces linking the opposing surface 163 and the outer main surface 165.

In a manner similar to the first exterior member 150, a second terminal portion 167 is formed in the second exterior member 160. The second terminal portion 167 is a structure for exposing at least part of the second connecting electrode 137. In a plan view of the outer main surface 155 of the first exterior member 150, the first terminal portion 157 is a hollow formed at a corner of the second exterior member 160 and is connected with the outer side surfaces 166. The second terminal portion 167 is formed from the opposing surface 163 to the outer main surface 165 in the third direction D3.

According to an exemplary aspect, the first and second exterior members 150 and 160 are made of the same material as the quartz crystal substrate 110, that is, they are made of a synthetic quartz crystal. This can reduce the occurrence of distortion caused by the difference in the coefficient of thermal expansion between the first and second exterior members 150 and 160 and the quartz crystal substrate 110. One of the first and second exterior members 150 and 160 may be made of a synthetic quartz crystal, and the other one of the first and second exterior members 150 and 160 may be made of another material. This can reduce the occurrence of distortion at least caused by the difference in the coefficient of thermal expansion between one of the exterior members and the quartz crystal substrate 110. The material for the first and second exterior members 150 and 160 is not limited to a quartz crystal. For example, the first and second exterior members 150 and 160 may be made of a ceramic material. In this case, they may desirably be made of a ceramic material having a coefficient of thermal expansion close to a quartz crystal.

In a plan view of the first main surface 110A of the quartz crystal substrate 110, the first and second terminal portions 157 and 167 are formed on the same side of the quartz crystal substrate 110 such that they overlap different corners of the quartz crystal substrate 110. That is, the first and second terminal portions 157 and 167 are arranged on the long side of the quartz crystal substrate 110 on the negative side of the second direction D2. The corners at which the first and second terminal portions 157 and 167 are formed are not limited to those on the negative side of the second direction D2. The first and second terminal portions 157 and 167 may be formed at corners on the positive side of the second direction D2, on the positive side of the first direction D1, or on the negative side of the first direction D1. The first and second terminal portions 157 and 167 may alternatively be formed to overlap diagonally positioned corners of the quartz crystal substrate 110.

In addition, the first and second terminal portions 157 and 167 may be formed at positions other than the corners if they expose the first and second connecting electrodes 127 and 137, respectively. If the first connecting electrode 127 is disposed at the central portion on an edge side (a long side or a short side of the rectangular quartz crystal substrate 110) separate from the corners of the quartz crystal substrate 110, the first terminal portion 157 may be formed at the central portion of an edge side of the first exterior member 150 in a plan view of the outer main surface 155 of the first exterior member 150, for example. If the second connecting electrode 137 is disposed at the central portion on an edge side separate from the corners of the quartz crystal substrate 110, the second terminal portion 167 may be formed at the central portion of an edge side of the second exterior member 160 in a plan view of the outer main surface 165 of the second exterior member 160. Moreover, the first terminal portion 157 may be a hollow formed on the opposing surface 153 and separate from the outer main surface 155. The second terminal portion 167 may be a hollow formed on the opposing surface 163 and separate from the outer main surface 165. The first terminal portion 157 may be a through-hole passing through the side wall portion 152 of the first exterior member 150. The second terminal portion 167 may be a through-hole passing through the side wall portion 162 of the second exterior member 160.

The opposing surface 153 of the first exterior member 150 is bonded to the first main surface 110A of the quartz crystal substrate 110 corresponding to the position of the peripheral portion 112, with the first conductive sealing member 123 interposed therebetween. With this configuration, the first exterior member 150 seals the first excitation electrode 121 within the inner space 115 so that the excitation portion 111 of the quartz crystal substrate 110 can be excited. The opposing surface 163 of the second exterior member 160 is bonded to the second main surface 110B of the quartz crystal substrate 110 corresponding to the position of the peripheral portion 112, with the second conductive sealing member 133 interposed therebetween. With this configuration, the second exterior member 160 seals the second excitation electrode 131 within the inner space 116 so that the excitation portion 111 of the quartz crystal substrate 110 can be excited. In addition to the first conductive sealing member 123, at least one more member may be disposed between the opposing surface 153 of the first exterior member 150 and the first main surface 110A of the quartz crystal substrate 110. For example, a metallized layer for enhancing the adhesion with a metal may be formed on the opposing surface 153 of the first exterior member 150. In addition, a brazing material made of a eutectic gold-tin (Au—Sn) alloy may be provided on the first conductive sealing member 123. A metallized layer and/or a brazing material may also be provided between the opposing surface 163 of the second exterior member 160 and the second main surface 110B of the quartz crystal substrate 110.

The inner spaces 115 and 116 are desirably in a vacuum state in which the air pressure is lower than the atmospheric pressure. This makes it less likely to oxidize the first and second excitation electrodes 121 and 131, and the weight of the quartz crystal resonator unit 100 is not changed, thereby reducing a temporal change in the resonance characteristics of the quartz crystal resonator unit 100. Additionally, the first and second extended electrodes 125 and 135 are less likely to oxidize, and the conductivity of the quartz crystal resonator unit 100 is not decreased, thereby reducing operation faults of the quartz crystal resonator unit 100. A residual gas within the inner spaces 115 and 116 is air containing oxygen ($O_2$), for example, which may be replaced by an inactive gas having a low reactivity with a metal or a reducing gas having a high reactivity with oxygen, for example. This can reduce oxidation of the various electrodes.

It should be appreciated that the shape of the first exterior member 150 is not restricted to the above-described recessed shape if the inner space 115 can be formed between the first exterior member 150 and the first excitation electrode 121. Likewise, the shape of the second exterior member 160 is not restricted to the above-described recessed shape if the inner space 116 can be formed between the second exterior member 160 and the second excitation electrode 131. For example, if the peripheral portion 112 is thicker than the excitation portion 111 in the quartz crystal substrate 110, at least one of the first and second exterior members 150 and 160 may be formed in a flat shape.

In the quartz crystal resonator unit 100, first and second outer electrodes 129 and 139 are formed that are electrically connected to the first and second excitation electrodes 121 and 131, respectively. The first outer electrode 129 covers part of the outer main surface 155 and part of the outer side surfaces 156 of the first exterior member 150 so as to cover the first terminal portion 157. The first outer electrode 129 also covers part of the outer main surface 165 and part of the outer side surfaces 166 of the second exterior member 160. The second outer electrode 139 covers part of the outer main surface 165 and part of the outer side surfaces 166 of the second exterior member 160 so as to cover the second terminal portion 167. The second outer electrode 139 also covers part of the outer main surface 155 and part of the outer side surfaces 156 of the first exterior member 150. This configuration can electrically connect the first outer electrode 129 to the first connecting electrode 127 at an end portion of the quartz crystal resonator 101 without providing a via-hole in the first exterior member 150. Similarly, this configuration can also electrically connect the second outer electrode 139 to the second connecting electrode 137 at an end portion of the quartz crystal resonator 101 without providing a via-hole in the second exterior member 160. It is thus less likely that the air tightness within the inner spaces 115 and 116 is decreased and that the mechanical strength of the first and second exterior members 150 and 160 is reduced.

As shown in FIG. 4, for example, the first outer electrode 129 covers the exposed portion of the first connecting electrode 127, which is exposed by the first terminal portion 157 and protrudes from the first exterior member 150. The second outer electrode 139 covers the exposed portion of the second connecting electrode 137, which is exposed by the second terminal portion 167 and protrudes from the second exterior member 160. This configuration can increase the contact area between the first outer electrode 129 and the first connecting electrode 127, thereby stabilizing the electrical connection therebetween. This configuration can also increase the contact area between the second outer electrode 139 and the second connecting electrode 137, thereby stabilizing the electrical connection therebetween.

More specifically, the first outer electrode 129 contacts, not only the side surface of the first connecting electrode 127, but also part of the front surface thereof, and the second outer electrode 139 contacts, not only the side surface of the second connecting electrode 137, but also part of the front surface thereof. With this configuration, when the resonance generated in the excitation portion 111 reaches the first connecting electrode 127 after being transmitted through the first extended electrode 125, the reflection of the transmitted resonance at the contact area between the first connecting electrode 127 and the first outer electrode 129 can be reduced. That is, the transmitted resonance is less likely to return to the first excitation electrode 121. Likewise, the reflection of the transmitted resonance at the contact area between the second connecting electrode 137 and the second outer electrode 139 can be reduced, and the transmitted resonance is less likely to return to the second excitation electrode 131. It is thus possible to reduce the transmitted resonance to be added to the resonance generated in the excitation portion 111, and the resonance characteristics are less likely to be degraded.

In addition, the first outer electrode 129 is thicker than the first connecting electrode 127, and the second outer electrode 139 is thicker than the second connecting electrode 137. This can reduce the transmission of resonance from the outer electrodes to the connecting electrodes.

The first and second outer electrodes 129 and 139 are disposed to partially overlap the first and second connecting electrodes 127 and 137, respectively, and are thus located at the corners of the quartz crystal substrate 110 in a plan view of the first main surface 110A of the quartz crystal substrate 110. With this configuration, the distance between the first outer electrode 129 and the first excitation electrode 121 can be made longer than that in the configuration in which the first connecting electrode 127 and the first outer electrode 129 are disposed at the central portion of an edge side of the quartz crystal substrate 110. It is thus possible to attenuate the resonance transmitted through the first extended electrode 125 from the excitation portion 111. Similarly, it is possible to attenuate the resonance transmitted through the second extended electrode 135 from the excitation portion 111.

The first and second outer electrodes 129 and 139 are arranged at the end portions on the same side of the quartz crystal substrate 110, and more specifically, at the end portions of the long side on the negative side of the second direction D2. With this configuration, the quartz crystal resonator unit 100 can be placed vertically in a state in which, while causing the side of the quartz crystal resonator unit 100 on which the first and second outer electrodes 129 and 139 are disposed to face an external substrate, the first and second main surfaces 110A and 110B of the quartz crystal substrate 110 vertically stand on the external substrate. The first and second outer electrodes 129 and 139 may be disposed at any position if they are electrically connected to the first and second connecting electrodes 127 and 137, respectively. They may be located at diagonally positioned corners of the quartz crystal substrate 110 or at the central portions of edge sides separate from the corners.

In the quartz crystal resonator unit 100, an alternating voltage is applied to between the first and second excitation electrodes 121 and 131 via the first and second outer electrodes 129 and 139. This causes the excitation portion 111 of the quartz crystal substrate 110 to resonate in a predetermined resonance mode, such as the thickness shear mode, and the resonance characteristics based on the resonance mode are exhibited. By utilizing the resonance characteristics, the quartz crystal resonator unit 100 can be used as a timing device which resonates at a predetermined frequency. When a load is applied in a direction along the first main surface 110A of the quartz crystal substrate 110, the excitation portion 111 is deformed so as to change the resonance characteristics of the quartz crystal resonator unit 100. By utilizing this change in the resonance characteristics, the quartz crystal resonator unit 100 can be used as a load sensor for measuring a load.

Figure 5:
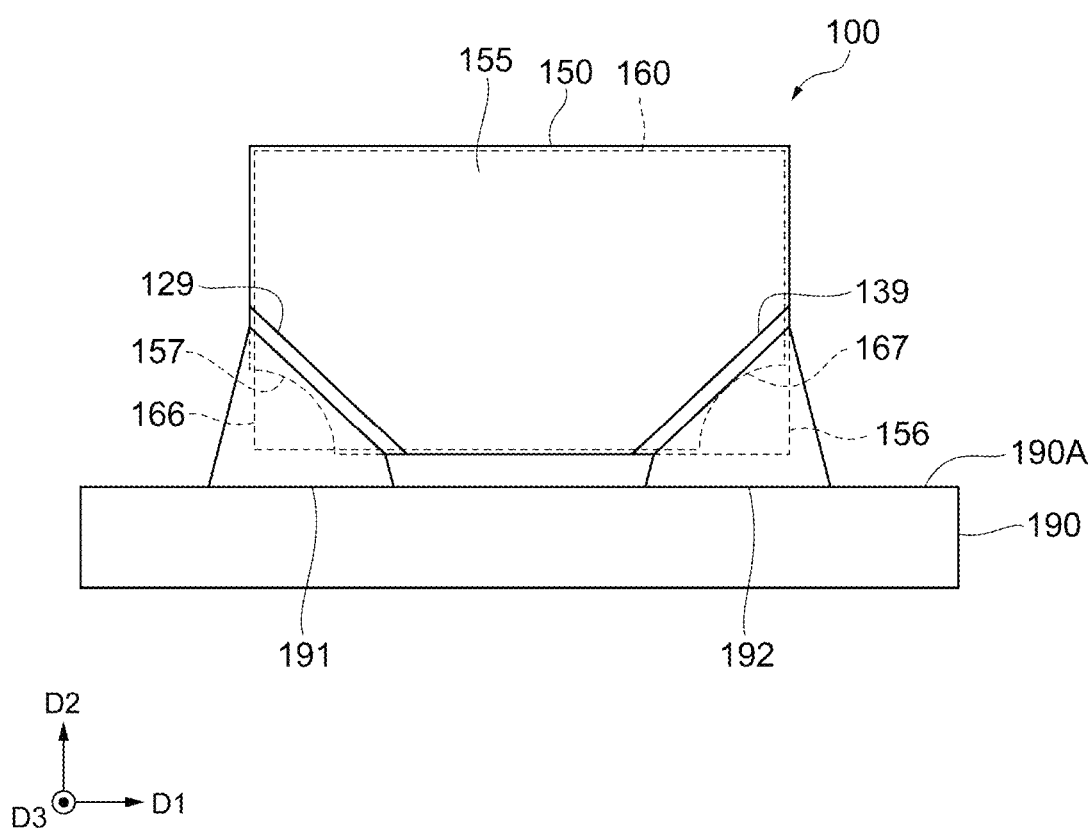
FIG. 5 is a schematic view illustrating an example of a mode in which the quartz crystal resonator unit according to the first exemplary embodiment is mounted on an external substrate.

An example of a mounting mode of the quartz crystal resonator unit 100 will be discussed below with reference to FIG. 5. FIG. 5 is a schematic view illustrating an example of a mode in which the quartz crystal resonator unit according to the first embodiment is mounted on an external substrate.

As shown, the quartz crystal resonator unit 100 is mounted on an external substrate 190 by using solder 191 and solder 192. The solder 191 electrically connects the first outer electrode 129 and the external substrate 190, while the solder 192 electrically connects the second outer electrode 139 and the external substrate 190. In the quartz crystal resonator unit 100, the first and second terminal portions 157 and 167 and the outer side surfaces 156 and 166 oppose the external substrate 190, and the outer main surface 155 of the first exterior member 150 extends in a direction substantially perpendicularly to a mounting surface 190A of the external substrate 190. That is, the quartz crystal resonator unit 100 is mounted vertically on the external substrate 190 in a state in which the quartz crystal substrate 110 vertically stands on the external substrate 190. This can reduce the mounting area of the quartz crystal resonator unit 100. Additionally, the deformation of the excitation portion 111 based on a load applied in a direction normal to the mounting surface 190A of the external substrate 190 becomes greater than when the quartz crystal resonator unit 110 is horizontally mounted on the external substrate 190 in a state in which the quartz crystal substrate 110 lies on the external substrate 190. That is, the resonance characteristics of the vertically mounted quartz crystal resonator unit 100 are changed by a greater amount in response to a load. The quartz crystal resonator unit 100 can thus be suitably used as a load sensor for detecting a load applied in a direction normal to the mounting surface 190A of the external substrate 190.

The solder 191 and the solder 192 respectively spread out along the first and second terminal portions 157 and 167. In other words, the solder 191 and the solder 192 respectively penetrate into the hollows of the first and second exterior members 150 and 160. This configuration stabilizes the mounting position of the quartz crystal resonator unit 100 because of the anchor effect and the increased area of the first and second outer electrodes 129 and 139. It is thus possible to enhance the bonding strength of the quartz crystal resonator unit 100 to the external substrate 190.

Additional exemplary embodiments will be described below. The following embodiments will be described only by referring to points different from the first embodiment while omitting an explanation of the same points as the first embodiment. It is assumed that elements designated by like reference numerals of the first embodiment have configurations and functions similar to those of the counterparts of the first embodiment, and a detailed explanation thereof will be omitted. An explanation of similar advantages obtained by similar configurations will not be repeated.

Second Exemplary Embodiment

Figure 6:
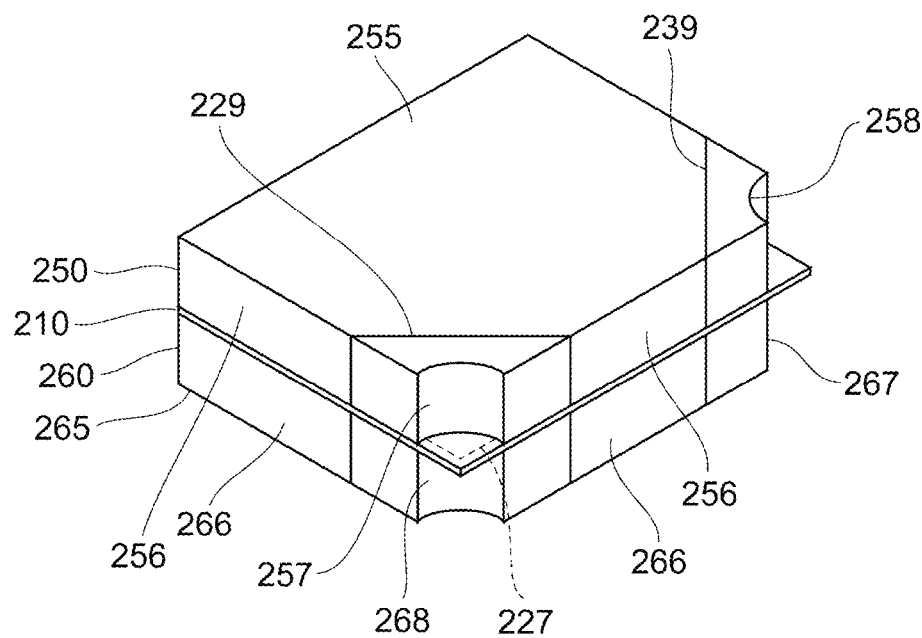
FIG. 6 is a perspective view schematically illustrating the configuration of a quartz crystal resonator unit according to a second exemplary embodiment.

The configuration of a quartz crystal resonator unit according to a second exemplary embodiment will be described below with reference to FIG. 6. FIG. 6 is a perspective view schematically illustrating the configuration of the quartz crystal resonator unit according to the second embodiment.

A quartz crystal resonator unit 200 includes a quartz crystal substrate 210 and first and second exterior members 250 and 260. The first exterior member 250 has an outer main surface 255 and outer side surfaces 256. A first terminal portion 257 is formed in the first exterior member 250. The second exterior member 260 has an outer main surface 265 and outer side surfaces 266. A second terminal portion 267 is formed in the second exterior member 260. In the quartz crystal resonator unit 200, a first outer electrode 229 is formed to cover a first connecting electrode 227 which is exposed by the first terminal portion 257 and protrudes from the first exterior member 250. In the quartz crystal resonator unit 200, a second outer electrode 239 is formed to cover a second connecting electrode, which is not shown, being exposed by the second terminal portion 267 and protruding from the second exterior member 260.

The quartz crystal resonator unit 200 according to the second embodiment is different from the quartz crystal resonator unit 100 according to the first embodiment in that a third terminal portion 268 is formed in the second exterior member 260 and a fourth terminal portion 258 is formed in the first exterior member 250.

The third terminal portion 268 of the second exterior member 260 is disposed to oppose the first terminal portion 257 of the first exterior member 250 and is formed in a shape which externally exposes a corner of the quartz crystal substrate 210. The third terminal portion 268 is formed along the outer side surfaces 266 of the second exterior member 260 and reaches the outer main surface 265. The first outer electrode 229 is also provided on the third terminal portion 268 and also on the second main surface at the corner of the quartz crystal substrate 210 which is exposed by the third terminal portion 268. The shape of the third terminal portion 268 is symmetrical to that of the first terminal portion 257 with respect to the quartz crystal substrate 210, for example.

As further shown, the fourth terminal portion 258 of the first exterior member 250 is disposed to oppose the second terminal portion 267 of the second exterior member 260 and is formed in a shape which externally exposes a corner of the quartz crystal substrate 210. The fourth terminal portion 258 is formed along the outer side surfaces 256 of the first exterior member 250 and reaches the outer main surface 255. The second outer electrode 239 is provided also on the fourth terminal portion 258 and also on the first main surface at the corner of the quartz crystal substrate 210, which is exposed by the fourth terminal portion 258. The shape of the fourth terminal portion 258 is symmetrical to that of the second terminal portion 267 with respect to the quartz crystal substrate 210, for example. The third terminal portion 268 may be formed in a shape asymmetrical to that of the first terminal portion 257, and the fourth terminal portion 258 may be formed in a shape asymmetrical to that of the second terminal portion 267.

As a result of forming the third and fourth terminal portions 268 and 258, the areas of the first and second outer electrodes 229 and 239 are increased, and the anchor effect is exhibited by solder being penetrated into the third and fourth terminal portions 268 and 258. This further enhances the adhesion strength of the first and second outer electrodes 229 and 239 to solder. When the quartz crystal resonator unit 200 is vertically mounted on an external substrate, solder can spread out substantially symmetrically, thereby stabilizing the mounting position of the quartz crystal resonator unit 200.

Third Exemplary Embodiment

Figure 7:
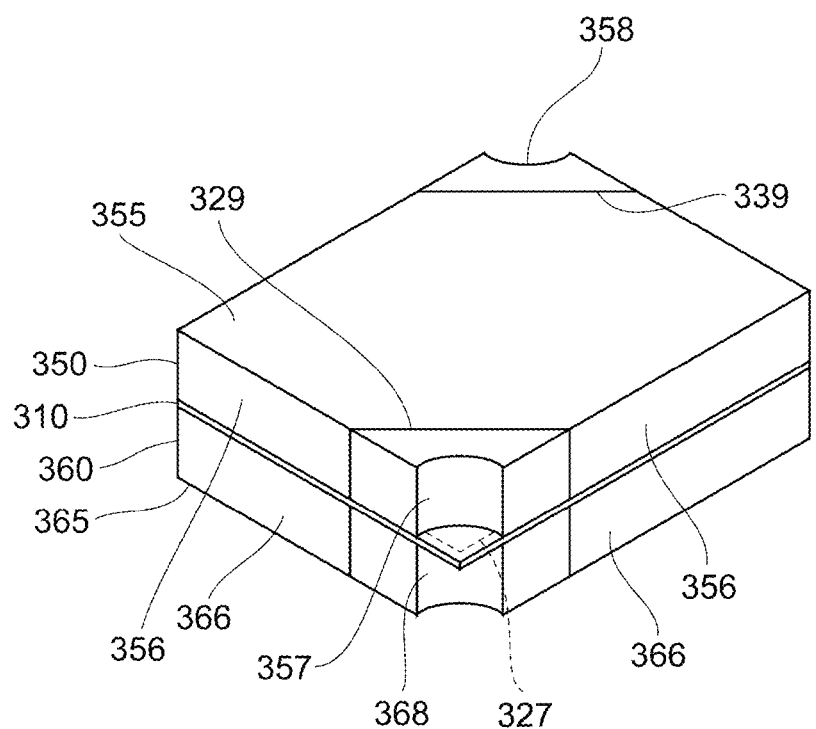
FIG. 7 is a perspective view schematically illustrating the configuration of a quartz crystal resonator unit according to a third exemplary embodiment.

The configuration of a quartz crystal resonator unit according to a third embodiment will be described below with reference to FIG. 7. FIG. 7 is a perspective view schematically illustrating the configuration of the quartz crystal resonator unit according to the third embodiment.

A quartz crystal resonator unit 300 includes a quartz crystal substrate 310 and first and second exterior members 350 and 360. The first exterior member 350 has an outer main surface 355 and outer side surfaces 356. A first terminal portion 357 is formed in the first exterior member 350. The second exterior member 360 has an outer main surface 365 and outer side surfaces 366. A second terminal portion is formed in the second exterior member 360. A third terminal portion 368 is formed in the second exterior member 360, while a fourth terminal portion 358 is formed in the first exterior member 350. In the quartz crystal resonator unit 300, a first outer electrode 329 is formed to cover a first connecting electrode 327 which is exposed by the first terminal portion 357 and protrudes from the first exterior member 350. In the quartz crystal resonator unit 300, a second outer electrode 339 is formed to cover a second connecting electrode, which is not shown, being exposed by the second terminal portion, which is not shown, and protruding from the second exterior member 360.

The quartz crystal resonator unit 300 according to the third embodiment is different from the quartz crystal resonator unit 200 according to the second embodiment in that the second terminal portion and the fourth terminal portion 358 are formed at a corner diagonal to the corner at which the first and third terminal portions 357 and 368 are formed.

The quartz crystal resonator unit 300 according to this exemplary embodiment provides advantages similar to the above-described advantages.

Fourth Exemplary Embodiment

Figure 8:
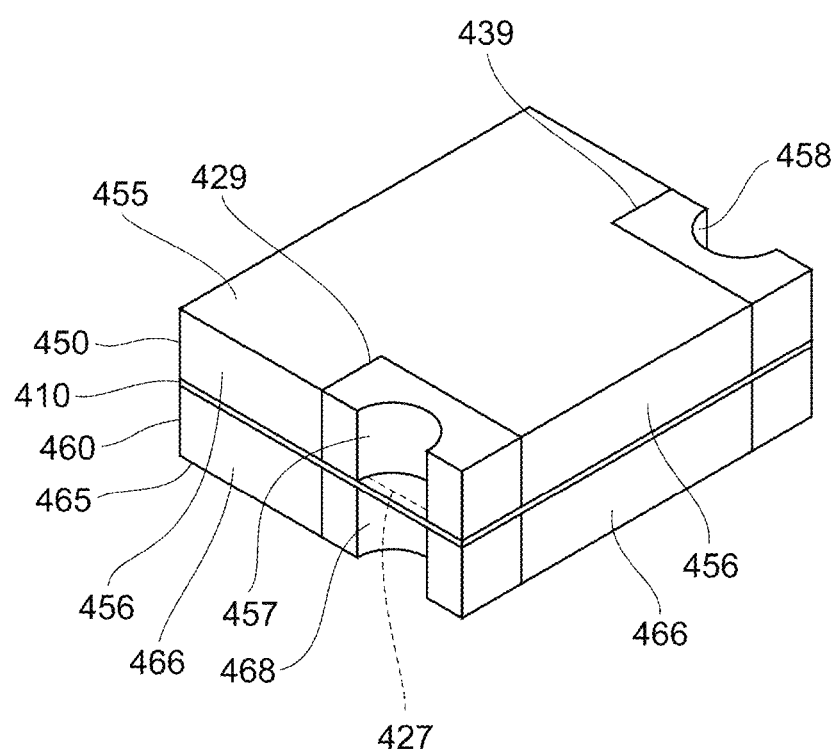
FIG. 8 is a perspective view schematically illustrating the configuration of a quartz crystal resonator unit according to a fourth exemplary embodiment.

The configuration of a quartz crystal resonator unit according to a fourth embodiment will be described below with reference to FIG. 8. FIG. 8 is a perspective view schematically illustrating the configuration of the quartz crystal resonator unit according to the fourth embodiment.

A quartz crystal resonator unit 400 includes a quartz crystal substrate 410 and first and second exterior members 450 and 460. The first exterior member 450 has an outer main surface 455 and outer side surfaces 456. A first terminal portion 457 is formed in the first exterior member 450. The second exterior member 460 has an outer main surface 465 and outer side surfaces 466. A second terminal portion is formed in the second exterior member 460. A third terminal portion 468 is formed in the second exterior member 460, while a fourth terminal portion 458 is formed in the first exterior member 450. In the quartz crystal resonator unit 400, a first outer electrode 429 is formed to cover a first connecting electrode 427 which is exposed by the first terminal portion 457 and protrudes from the first exterior member 450. In the quartz crystal resonator unit 400, a second outer electrode 439 is formed to cover a second connecting electrode, which is not shown, being exposed by the second terminal portion, which is not shown, and protruding from the second exterior member 460.

The quartz crystal resonator unit 400 according to the fourth embodiment is different from the quartz crystal resonator unit 200 according to the second embodiment in that the first and third terminal portions 457 and 468 are formed at the central portion of an edge side separate from the corners and that the second terminal portion and the fourth terminal portion 458 are formed at the central portion of an edge side separate from the corners.

The quartz crystal resonator unit 400 according to this exemplary embodiment provides advantages similar to the above-described advantages.

Fifth Exemplary Embodiment

Figure 9:
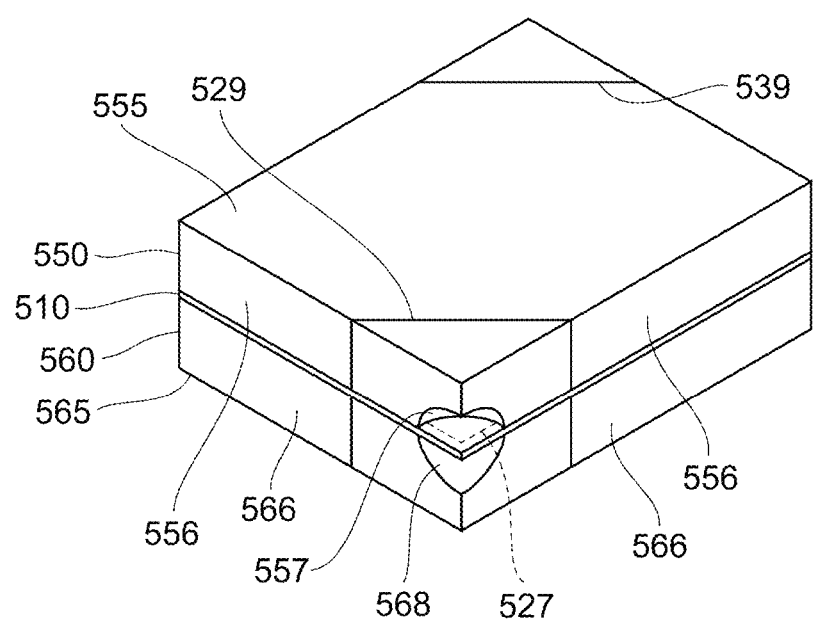
FIG. 9 is a perspective view schematically illustrating the configuration of a quartz crystal resonator unit according to a fifth exemplary embodiment.

The configuration of a quartz crystal resonator unit according to a fifth embodiment will be described below with reference to FIG. 9. FIG. 9 is a perspective view schematically illustrating the configuration of the quartz crystal resonator unit according to the fifth embodiment.

A quartz crystal resonator unit 500 includes a quartz crystal substrate 510 and first and second exterior members 550 and 560. The first exterior member 550 has an outer main surface 555 and outer side surfaces 556. A first terminal portion 557 is formed in the first exterior member 550. The second exterior member 560 has an outer main surface 565 and outer side surfaces 566. A second terminal portion is formed in the second exterior member 560. A third terminal portion 568 is formed in the second exterior member 560, while a fourth terminal portion is formed in the first exterior member 550. In the quartz crystal resonator unit 500, a first outer electrode 529 is formed to cover a first connecting electrode 527 which is exposed by the first terminal portion 557 and protrudes from the first exterior member 550. In the quartz crystal resonator unit 500, a second outer electrode 539 is formed to cover a second connecting electrode, which is not shown, being exposed by the second terminal portion, which is not shown, and protruding from the second exterior member 560.

The quartz crystal resonator unit 500 according to the fifth embodiment is different from the quartz crystal resonator unit 300 according to the third embodiment in that the first terminal portion 557 is a hollow which is formed on the side opposing the quartz crystal substrate 510 and which is separate from the outer main surface 555 and that the third terminal portion 568 is a hollow which is formed on the side opposing the quartz crystal substrate 510 and which is separate from the outer main surface 565. The second and fourth terminal portions are formed similarly to the third and first terminal portions 568 and 557, though they are not shown. That is, the first exterior member 550 is formed in a rectangular shape in a plan view of the outer main surface 555, while the second exterior member 560 is formed in a rectangular shape in a plan view of the outer main surface 565.

The quartz crystal resonator unit 500 according to this exemplary embodiment provides advantages similar to the above-described advantages.

Sixth Exemplary Embodiment

Figure 10:
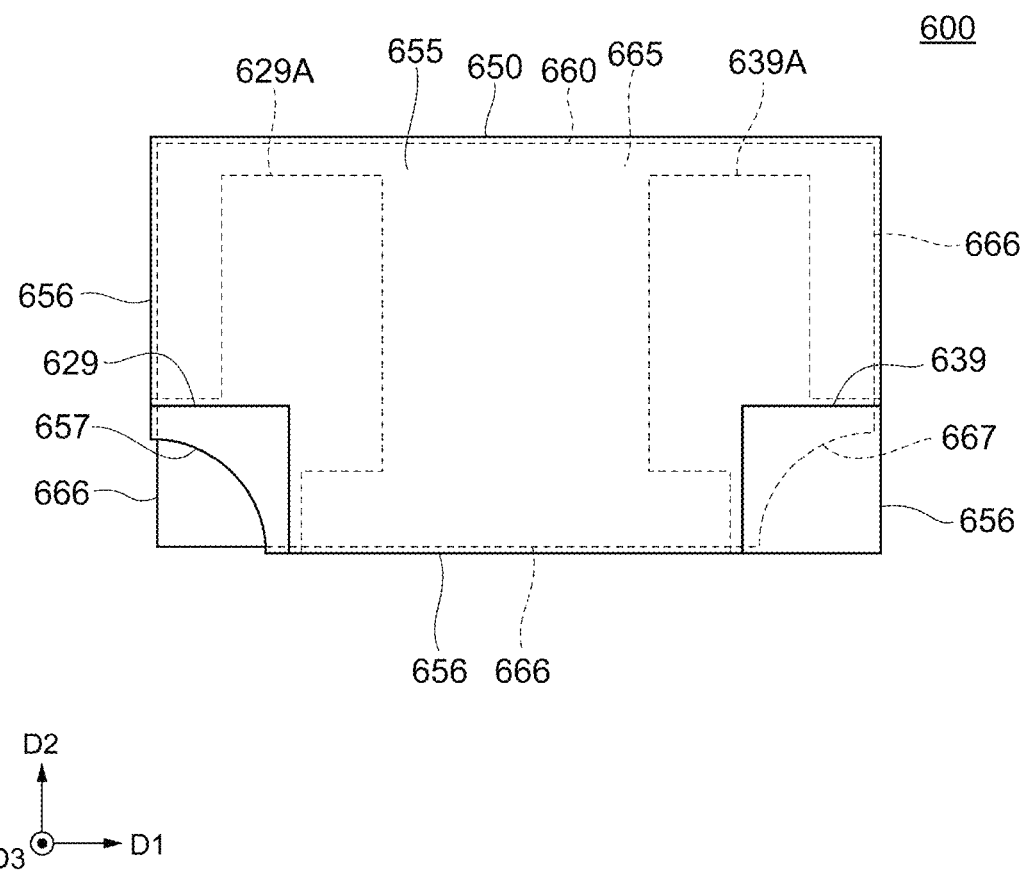
FIG. 10 is a plan view schematically illustrating the configuration of a quartz crystal resonator unit according to a sixth exemplary embodiment.
Figure 11:
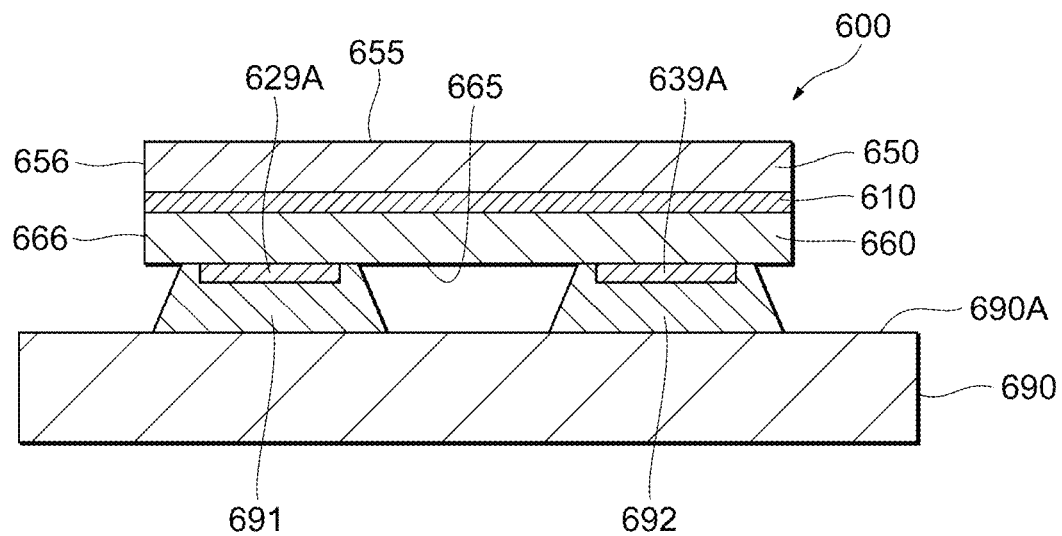
FIG. 11 is a schematic view illustrating an example of a mode in which the quartz crystal resonator unit according to the sixth exemplary embodiment is mounted on an external substrate.

The configuration of a quartz crystal resonator unit 600 according to a sixth embodiment and a mounting mode of the quartz crystal resonator unit 600 on an external substrate 690 will be described below with reference to FIGS. 10 and 11. FIG. 10 is a plan view schematically illustrating the configuration of the quartz crystal resonator unit according to the sixth embodiment. FIG. 11 is a schematic view illustrating an example of a mode in which the quartz crystal resonator unit according to the sixth embodiment is mounted on an external substrate.

The quartz crystal resonator unit 600 includes a quartz crystal substrate 610, first and second exterior members 650 and 660, and first and second outer electrodes 629 and 639. At one corner of the quartz crystal resonator unit 600, the first outer electrode 629 is disposed on an outer main surface 655, outer side surfaces 656, and a first terminal portion 657 of the first exterior member 650 and is also disposed on an outer main surface 665 and outer side surfaces 666 of the second exterior member 660. At another corner of the quartz crystal resonator unit 600, the second outer electrode 639 is disposed on the outer main surface 655 and the outer side surfaces 656 of the first exterior member 650 and is also disposed on the outer main surface 665, the outer side surfaces 666, and a second terminal portion 667 of the second exterior member 660.

The quartz crystal resonator unit 600 according to the sixth embodiment is different from the quartz crystal resonator unit 100 according to the first embodiment in that the first outer electrode 629 includes a bonding portion 629A extending on the outer main surface 665 of the second exterior member 660 and that the second outer electrode 639 includes a bonding portion 639A extending on the outer main surface 665 of the second exterior member 660.

The bonding portion 629A of the first outer electrode 629 extends at the central portion of the outer main surface 665 of the second exterior member 660. The bonding portion 639A of the second outer electrode 639 extends at the central portion of the outer main surface 665 of the second exterior member 660. The bonding portions 629A and 639A are arranged in the first direction D1 with a gap therebetween.

As shown in FIG. 11, the quartz crystal resonator unit 600 is mounted such that the outer main surface 665 of the second exterior member 660 opposes a mounting surface 690A of the external substrate 690. That is, the quartz crystal resonator unit 600 is horizontally mounted such that the quartz crystal substrate 610 lies on the external substrate 690. The bonding portion 629A of the first outer electrode 629 is bonded to solder 691, while the bonding portion 639A of the second outer electrode 639 is bonded to solder 692.

With this configuration, the area of the first and second outer electrodes 629 and 639 can be increased, thereby improving the bonding strength between the quartz crystal resonator unit 600 and the external substrate 690. The stability of electrical connection between the quartz crystal resonator unit 600 and the external substrate 690 is also enhanced by this configuration. In an exemplary aspect, the quartz crystal resonator unit 600 is horizontally placed. The excitation portion is thus deformed only by a small amount in response to a load applied in a direction normal to the mounting surface 690A of the external substrate 690. That is, the resonance characteristics of the quartz crystal resonator unit 600 are less likely to be changed in response to a load applied in a direction normal to the mounting surface 690A of the external substrate 690. The horizontally placed quartz crystal resonator unit 600 can thus be suitably used as a timing device, which requires stable resonance characteristics, or as a reference for a load sensor.

Seventh Exemplary Embodiment

Figure 12:
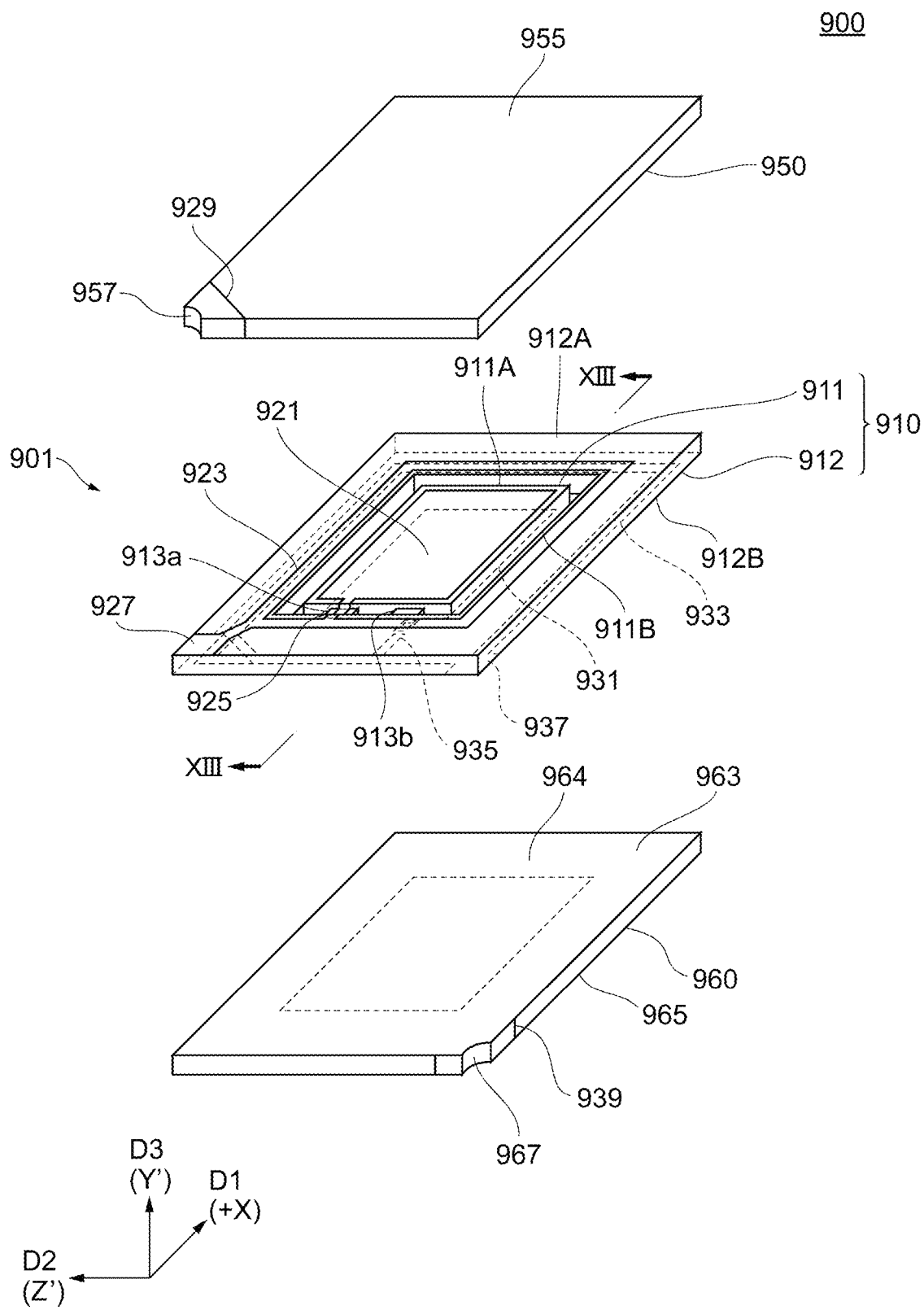
FIG. 12 is an exploded perspective view schematically illustrating the configuration of a quartz crystal resonator unit according to a seventh exemplary embodiment.

The configuration of a quartz crystal resonator unit 900 according to a seventh embodiment will be discussed below with reference to FIGS. 12 and 13. FIG. 12 is an exploded perspective view schematically illustrating the configuration of the quartz crystal resonator unit according to the seventh embodiment. FIG. 13 is a sectional view schematically illustrating the configuration of the quartz crystal resonator unit according to the seventh embodiment.

The quartz crystal resonator unit 900 includes a quartz crystal resonator 901 and first and second exterior members 950 and 960.

The quartz crystal resonator 901 includes a quartz crystal substrate 910 formed by an excitation portion 911 and a peripheral portion 912. A slit is formed between the excitation portion 911 and the peripheral portion 912. The excitation portion 911 has first and second main surfaces 911A and 911B. The peripheral portion 912 has first and second main surfaces 912A and 912B. The first main surface 911A and the first main surface 912A are located closer to the first exterior member 950. The second main surface 911B and the second main surface 912B are located closer to the second exterior member 960.

In a plan view of the first main surface 911A of the excitation portion 911, the excitation portion 911 has a rectangular shape having a long side along the first direction D1 and a short side along the second direction D2. The peripheral portion 912 surrounds the excitation portion 911 with a gap therebetween and has a rectangular frame-like shape having a long side along the first direction D1 and a short side along the second direction D2. According to an exemplary aspect, the thickness of the peripheral portion 912 along the third direction D3 (hereinafter simply called "the thickness of the peripheral portion 912") is greater than that of the excitation portion 911. The first main surface 912A of the peripheral portion 912 is located closer to the first exterior member 950 than the first main surface 911A of the excitation portion 911. The second main surface 912B of the peripheral portion 912 is located closer to the second exterior member 960 than the second main surface 911B of the excitation portion 911.

Forming of a slit in the quartz crystal substrate 910 can improve the efficiency of trapping the resonance generated in the excitation portion 911. The excitation portion 911 is free to be displaced and deformed, which would be restricted if it is provided continuously from the peripheral portion 912. That is, the excitation portion 911 can be displaced and deformed more flexibly. It is also possible to reduce the transmission of the unwanted resonance produced in the peripheral portion 912 to the excitation portion 911. Because of the above-described reasons, the resonance characteristics of the quartz crystal resonator unit 900 can be improved. By the provision of a slit in the quartz crystal substrate 910, the excitation portion 911 is deformed only by a small amount in response to an external load applied to the quartz crystal resonator unit 900. The resonance characteristics of the quartz crystal resonator unit 900 are thus less likely to be changed in response to a load. As a result, the quartz crystal resonator unit 900 can be suitably used as a timing device, which requires stable resonance characteristics.

As further shown in FIG. 12, for example, the excitation portion 911 is supported by the peripheral portion 912 via first and second support portions 913a and 913b. The first and second support portions 913a and 913b are connected to the short side of the peripheral portion 912 on the negative side of the first direction D1. The first and second support portions 913a and 913b extend in the first direction D1 and are arranged in the second direction D2. The thickness of the first and second support portions 913a and 913b along the third direction D3 is smaller than that of the excitation portion 911. This can improve the efficiency of trapping the resonance generated in the excitation portion 911. The thickness of the first and second support portions 913a and 913b is smaller than that of the peripheral portion 912. This configuration can reduce the transmission of the unwanted resonance produced in the peripheral portion 912 to the excitation portion 911.

Moreover, a first excitation electrode 921 is provided on the first main surface 911A of the excitation portion 911, while a second excitation electrode 931 is provided on the second main surface 911B of the excitation portion 911. A first sealing member 923 and a first connecting electrode 927 are disposed on the first main surface 912A of the peripheral portion 912, while a second sealing member 933 and a second connecting electrode 937 are disposed on the second main surface 912B of the peripheral portion 912. A first extended electrode 925 extends on the surface of the first support portion 913a and electrically connects the first excitation electrode 921 and the first sealing member 923. A second extended electrode 935 extends on the surface of the second support portion 913b and electrically connects the second excitation electrode 931 and the second sealing member 933.

The first and second exterior members 950 and 960 are formed in a planar shape. An inner surface 954 and an opposing surface 953 of the first exterior member 950 form the same plane parallel with an outer main surface 955. An inner surface 964 and an opposing surface 963 of the second exterior member 960 form the same plane parallel with an outer main surface 965. A first terminal portion 957 is formed at a corner of the first exterior member 950, while a second terminal portion 967 is formed at a corner of the second exterior member 960. A first outer electrode 929 is disposed on the first terminal portion 957 and covers part of the first connecting electrode 927, which is exposed by the first terminal portion 957. A second outer electrode 939 is disposed on the second terminal portion 967 and covers part of the second connecting electrode 937, which is exposed by the second terminal portion 967. The first and second exterior members 950 and 960 are not restricted to a particular shape and may be formed in a recessed shape, that is, in a box-like shape opened toward the quartz crystal substrate 910.

As described above, according to an exemplary aspect, a piezoelectric resonator unit 100 is provided that includes a piezoelectric substrate 110, first and second excitation electrodes 121 and 131, first and second connecting electrodes 127 and 137, and first and second exterior members 150 and 160. The piezoelectric substrate 110 has first and second main surfaces 110A and 110B opposing each other. The first excitation electrode 121 is disposed on the first main surface 110A of the piezoelectric substrate 110. The first connecting electrode 127 is disposed on the first main surface 110A of the piezoelectric substrate 110 and is electrically connected to the first excitation electrode 121. The second excitation electrode 131 is disposed on the second main surface 110B of the piezoelectric substrate 110 and opposes the first excitation electrode 121 with the piezoelectric substrate 110 interposed therebetween. The second connecting electrode 137 is disposed on the second main surface 110B of the piezoelectric substrate 110 and is electrically connected to the second excitation electrode 131. The first exterior member 150 is bonded to the piezoelectric substrate 110 with a first sealing member 123 interposed therebetween and covers the first excitation electrode 121 with a space between the first exterior member 150 and the first excitation electrode 121. The second exterior member 160 is bonded to the piezoelectric substrate 110 with a second sealing member 133 interposed therebetween and covers the second excitation electrode 131 with a space between the second exterior member 160 and the second excitation electrode 131. The first exterior member 150 includes a first terminal portion 157. The first terminal portion 157 is formed in a shape which externally exposes at least part of the first connecting electrode 127. A first outer electrode 129 is provided to cover the first terminal portion 157 of the first exterior member 150 and an exposed portion of the first connecting electrode 127 protruding from the first exterior member 150.

According to the above-described aspect, the first connecting electrode and the first outer electrode contact each other so as to overlap each other. This configuration makes it less likely to cause the reflection of resonance, which has been generated in the excitation portion and transmitted therefrom, at the contact area between the first connecting electrode and the first outer electrode. That is, the transmitted resonance is less likely to return to the first excitation electrode. The transmitted resonance to be added to the resonance generated in the excitation portion can thus be reduced, and the resonance characteristics are less likely to be degraded. It is also possible to enhance the stability of the electrical connection between the first connecting electrode and the first outer electrode.

Moreover, the second exterior member 160 may include a second terminal portion 167. The second terminal portion 167 is formed in a shape which externally exposes at least part of the second connecting electrode 137. A second outer electrode 139 may also be provided to cover the second terminal portion 167 of the second exterior member 160 and an exposed portion of the second connecting electrode 137 protruding from the second exterior member 160. The second connecting electrode and the second outer electrode contact each other so as to overlap each other. This configuration makes it less likely to cause the reflection of resonance, which has been generated in the excitation portion and transmitted therefrom, at the contact area between the second connecting electrode and the second outer electrode. That is, the transmitted resonance is less likely to return to the second excitation electrode. The transmitted resonance to be added to the resonance generated in the excitation portion can thus be reduced, and the resonance characteristics are less likely to be degraded. It is also possible to enhance the stability of the electrical connection between the second connecting electrode and the second outer electrode.

The first and second sealing members 123 and 133 may have conductivity. A first extended electrode 125 may be disposed on the first main surface 110A of the piezoelectric substrate 110. The first extended electrode 125 electrically connects the first excitation electrode 121 and the first sealing member 123 with each other. A second extended electrode 135 may be disposed on the second main surface 110B of the piezoelectric substrate 110. The second extended electrode 135 electrically connects the second excitation electrode 131 and the second sealing member 133 with each other. With this arrangement, the piezoelectric substrate and the exterior members can be bonded to each other by brazing or soldering, thereby enhancing the air tightness of the piezoelectric resonator unit. It is thus possible to make it less likely to degrade the resonance characteristics.

In addition, the first connecting electrode 127 may be electrically connected to the first sealing member 123, and the second connecting electrode 137 may be electrically connected to the second sealing member 133. With this configuration, a voltage can be applied from the connecting electrodes provided at the end portions of the piezoelectric substrate to the excitation electrodes provided at the central portion of the piezoelectric substrate via the sealing members. According to the exemplary embodiments, the forming of via-holes in the piezoelectric substrate is not required, thereby reducing the size of the piezoelectric resonator unit. The mechanical strength of the piezoelectric resonator can also be enhanced.

The piezoelectric substrate 110 may have an externally rectangular shape in a plan view of the first main surface. In a plan view of the first main surface 110A of the piezoelectric substrate 110, the first outer electrode 129 may be disposed at one corner of the piezoelectric substrate 110, and the second outer electrode 139 may be disposed at another corner of the piezoelectric substrate 110. With this arrangement, the overlapping portions of the connecting electrodes with the outer electrodes are separated from the excitation portion, and the transmission paths through which resonance is transmitted from the excitation electrodes to the connecting electrodes can be made longer. Hence, the resonance transmitted from the excitation electrodes to the connecting electrodes can be attenuated.

The piezoelectric substrate 110 may have an externally rectangular shape in a plan view of the first main surface 110A. In a plan view of the first main surface 110A of the piezoelectric substrate 110, the first and second outer electrodes 129 and 139 may be disposed on the same side of the piezoelectric substrate 110. This makes it possible to mount the piezoelectric resonator unit vertically on an external substrate in a state in which the outer side surfaces of the exterior members oppose the external substrate and the main surfaces of the piezoelectric substrate are substantially perpendicular to the mounting surface of the external substrate. This can reduce the mounting area of the piezoelectric resonator unit. Additionally, when a load is applied to the vertically placed piezoelectric resonator unit in a direction normal to the mounting surface of the external substrate, the excitation portion of the piezoelectric substrate is deformed, and the resonance characteristics of the piezoelectric resonator unit are changed. Hence, the piezoelectric resonator unit can be suitably used as a load sensor.

The first and second outer electrodes 629 and 639 may extend on an outer main surface of the first exterior member 650 or the second exterior member 660, the outer main surface facing a side opposite the piezoelectric substrate 610. With this configuration, the piezoelectric resonator unit can be horizontally placed on an external substrate in a state in which the outer main surface of the exterior member opposes the external substrate. This can increase the area by which the outer electrodes contact solder so as to improve the bonding strength between the piezoelectric resonator unit and the external substrate. It is also possible to enhance the stability of electrical connection between the piezoelectric resonator unit and the external substrate. In the horizontally placed piezoelectric resonator unit, the excitation portion of the piezoelectric substrate is deformed only by a small amount in response to a load applied in a direction normal to the mounting surface of the external substrate. Hence, the piezoelectric resonator unit can be suitably used as a timing device, which requires stable resonance characteristics, or as a reference for a load sensor.

The second exterior member 260 may also include a third terminal portion 268. The third terminal portion 268 is disposed to oppose the first terminal portion 257 of the first exterior member 250 and is formed in a shape which externally exposes part of the piezoelectric substrate 210. The first exterior member 250 may also include a fourth terminal portion 258. The fourth terminal portion 258 is disposed to oppose the second terminal portion 267 of the second exterior member 260 and is formed in a shape which externally exposes part of the piezoelectric substrate 210. With this configuration, the areas of the outer electrodes are increased, and the anchor effect is exhibited by solder being penetrated into the third and fourth terminal portions. This further enhances the bonding strength of the piezoelectric resonator unit to an external substrate. When the piezoelectric resonator unit is vertically placed, solder can spread out substantially symmetrically, thereby stabilizing the mounting position of the piezoelectric resonator unit.

As further described above, the piezoelectric substrate 110 may be formed in a planar shape such that a region where the first excitation electrode 121 is disposed and a region where the first sealing member 123 is disposed are continuously provided. With this configuration, a load applied to the peripheral portion of the piezoelectric substrate is transmitted to the excitation portion and deforms it. Hence, the piezoelectric resonator unit can be suitably used as a load sensor.

In addition, in the piezoelectric substrate 910, a slit may be formed between a region where the first excitation electrode 921 is disposed and a region where the first sealing member 923 is disposed. With this configuration, the excitation portion can be displaced and deformed more flexibly. Additionally, a leakage of the resonance generated in the excitation portion of the piezoelectric substrate to the peripheral portion can be reduced, thereby improving the efficiency of trapping the resonance within the excitation portion. It is also possible to reduce the transmission of the unwanted resonance produced in the peripheral portion to the excitation portion. That is, the resonance characteristics of the piezoelectric resonator unit can be improved. Additionally, the excitation portion is less likely to be deformed in response to an external load. That is, the resonance characteristics of the piezoelectric resonator unit are less likely to be changed in response to a load. Hence, the piezoelectric resonator unit can be suitably used as a timing device, which requires stable resonance characteristics, or as a reference for a load sensor.

The piezoelectric substrate 110 may be a quartz crystal substrate. The piezoelectric resonator unit thus exhibits high-stability frequency characteristics over a wide temperature range and excellent temporal change characteristics. The piezoelectric resonator unit, which is sensitive to an external load, can also be suitably used as a load sensor.

At least one of the first and second exterior members 150 and 160 may be made of the same material as the quartz crystal substrate. This can reduce the occurrence of distortion caused by the difference in the coefficient of thermal expansion between the exterior member and the quartz crystal substrate. That is, the resonance characteristics are less likely to be changed by the thermal history of the quartz crystal resonator unit.

Moreover, the film thickness of the first outer electrode may be greater than that of the first connecting electrode. This can reduce the transmission of resonance from the outer electrode to the connecting electrode.

As described above, according to an exemplary aspect of the present invention, a piezoelectric resonator unit is provided whose resonance characteristics are less likely to be degraded.

It is noted that the above-described exemplary embodiments are provided for facilitating the understanding of the invention, but are not intended to be exhaustive or to limit the invention to the precise forms disclosed. It should be appreciated that modifications and/or improvements may be made without departing from the scope and spirit of the invention, and equivalents of the invention are also encompassed in the invention. That is, suitable design changes made to the embodiments by those skilled in the art are also encompassed in the invention within the scope and spirit of the invention. For example, the elements of the embodiments and the positions, materials, conditions, configurations, and sizes thereof are not restricted to those described in the embodiments and may be changed in an appropriate manner. The elements of the embodiments may be combined within a technically possible range, and configurations obtained by combining the elements of the embodiments are also encompassed in the invention within the scope and spirit of the invention.

REFERENCE SIGNS LIST

100 quartz crystal resonator unit (piezoelectric resonator unit)
101 quartz crystal resonator (piezoelectric resonator)
110 quartz crystal substrate (piezoelectric substrate)
110A, 110B main surface
121, 131 excitation electrode
123, 133 conductive sealing member (sealing member)
125, 135, 136 extended electrode
127, 137 connecting electrode
129, 139 outer electrode
150, 160 exterior member
151, 161 top wall portion
152, 162 side wall portion
153, 163 opposing surface
154, 164 inner surface
155, 165 outer main surface
156, 166 outer side surface
157, 167 terminal portion

The invention claimed is:

1. A piezoelectric resonator unit comprising:
a piezoelectric substrate having first and second main surfaces that oppose each other;
a first excitation electrode disposed on the first main surface of the piezoelectric substrate;
a first connecting electrode disposed on the first main surface of the piezoelectric substrate and electrically connected to the first excitation electrode;
a second excitation electrode disposed on the second main surface of the piezoelectric substrate and opposing the first excitation electrode with the piezoelectric substrate interposed therebetween;
a second connecting electrode disposed on the second main surface of the piezoelectric substrate and electrically connected to the second excitation electrode;
a first exterior member bonded to the piezoelectric substrate with a first conductive sealing member interposed therebetween, with the first exterior member including a first terminal portion that comprises a shape that externally exposes at least part of the first connecting electrode;
a second exterior member bonded to the piezoelectric substrate with a second conductive sealing member interposed therebetween;
a first outer electrode that covers the first terminal portion of the first exterior member and an exposed portion of the first connecting electrode that protrudes from the first exterior member;
a first extended electrode disposed on the first main surface of the piezoelectric substrate and that electrically connects the first excitation electrode to the first conductive sealing member; and
a second extended electrode disposed on the second main surface of the piezoelectric substrate and that electrically connects the second excitation electrode to the second conductive sealing member.

2. The piezoelectric resonator unit according to claim 1, wherein the second exterior member includes a second terminal portion that comprises a shape that externally exposes at least part of the second connecting electrode, and a second outer electrode covers the second terminal portion of the second exterior member and an exposed portion of the second connecting electrode that protrudes from the second exterior member.

3. The piezoelectric resonator unit according to claim 2, wherein the piezoelectric substrate comprises an externally rectangular shape in a plan view of the first main surface; and
wherein, in the plan view of the first main surface of the piezoelectric substrate, the first outer electrode is disposed at a first corner of the piezoelectric substrate and the second outer electrode is disposed at a second corner of the piezoelectric substrate.

4. The piezoelectric resonator unit according to claim 2, wherein the piezoelectric substrate comprises an externally rectangular shape in a plan view of the first main surface; and wherein, in the plan view of the first main surface of the piezoelectric substrate, the first and second outer electrodes are disposed on a same side of the piezoelectric substrate.

5. The piezoelectric resonator unit according to claim 2, wherein the second exterior member includes a third terminal portion that is disposed to oppose the first terminal portion of the first exterior member and comprises a shape that externally exposes a part of the piezoelectric substrate; and wherein the first exterior member includes a fourth terminal portion that is disposed to oppose the second terminal portion of the second exterior member and comprises a shape that externally exposes a part of the piezoelectric substrate.

6. The piezoelectric resonator unit according to claim 2, wherein the first outer electrode includes a first bonding portion that extends on an outer main surface of the second exterior member and the second outer electrode includes a second bonding portion that extends on an outer main surface of the second exterior member.

7. The piezoelectric resonator unit according to claim 1, wherein the first connecting electrode is electrically connected to the first conductive sealing member, and the second connecting electrode is electrically connected to the second conductive sealing member.

8. The piezoelectric resonator unit according to claim 1, wherein the first outer electrode extends on an outer main surface of the first exterior member that faces a side opposite the piezoelectric substrate.

9. The piezoelectric resonator unit according to claim 1, wherein the piezoelectric substrate comprises a planar shape, such that a region where the first excitation electrode is disposed is continuous with a region where the first sealing member is disposed.

10. The piezoelectric resonator unit according to claim 1, wherein the piezoelectric substrate is a quartz crystal substrate.

11. The piezoelectric resonator unit according to claim 10, wherein at least one of the first and second exterior members comprises a same material as the quartz crystal substrate.

12. The piezoelectric resonator unit according to claim 1, wherein the first outer electrode comprises a film thickness that is greater than a film thickness of the first connecting electrode.

13. The piezoelectric resonator unit according to claim 1, wherein the first conductive sealing member does not overlap the second conductive sealing member in a direction orthogonal to the main surface of the piezoelectric substrate.

14. The piezoelectric resonator unit according to claim 13, wherein the second conductive sealing member surrounds the first and second excitation electrodes, and the first conductive sealing member surrounds the second sealing member in a planar view of the main surface of the piezoelectric substrate.

15. The piezoelectric resonator unit according to claim 1, wherein the second connecting electrode is disposed outward of the first conductive sealing member, such that the second connecting electrode does not overlap the second conductive sealing member in a direction orthogonal to the main surface of the piezoelectric substrate.

16. The piezoelectric resonator unit according to claim 1, wherein first extended electrode intersects the second conductive sealing member relative to a direction orthogonal to the main surface of the piezoelectric substrate, and wherein a third extended electrode intersects the first conductive sealing member relative to the direction orthogonal to the main surface of the piezoelectric substrate.

17. A piezoelectric resonator unit comprising:
a piezoelectric substrate having first and second main surfaces that oppose each other;
a first excitation electrode disposed on the first main surface of the piezoelectric substrate;
a first connecting electrode disposed on the first main surface of the piezoelectric substrate and electrically connected to the first excitation electrode;
a second excitation electrode disposed on the second main surface of the piezoelectric substrate and opposing the first excitation electrode with the piezoelectric substrate interposed therebetween;
a second connecting electrode disposed on the second main surface of the piezoelectric substrate and electrically connected to the second excitation electrode;
a first exterior member bonded to the piezoelectric substrate with a first sealing member interposed therebetween, with the first exterior member including a first terminal portion that comprises a shape that externally exposes at least part of the first connecting electrode;
a second exterior member bonded to the piezoelectric substrate with a second sealing member interposed therebetween; and
a first outer electrode that covers the first terminal portion of the first exterior member and an exposed portion of the first connecting electrode that protrudes from the first exterior member,
wherein the piezoelectric substrate comprises a slit between a region where the first excitation electrode is disposed and a region where the first sealing member is disposed in a planar view thereof.

18. A piezoelectric resonator unit comprising:
a piezoelectric substrate;
an excitation electrode disposed on a surface of the piezoelectric substrate;
a connecting electrode disposed on the surface of the piezoelectric substrate and electrically connected to the first excitation electrode, with the connecting electrode extending towards an edge of the piezoelectric substrate;
a cover bonded to the piezoelectric substrate with a conductive sealing member interposed therebetween, with the cover including a shape that externally exposes at least part of the connecting electrode; and
an outer electrode that covers a portion of the cover and at least a portion of the connecting electrode that is exposed from the cover
an extended electrode disposed on the surface of the piezoelectric substrate and that electrically connects the excitation electrode to the conductive sealing member.

* * * * *